US009997521B2

(12) United States Patent
Kim et al.

(10) Patent No.: US 9,997,521 B2
(45) Date of Patent: Jun. 12, 2018

(54) SEMICONDUCTOR DEVICES

(71) Applicant: Samsung Electronics Co., Ltd., Suwon-si, Gyeonggi-do (KR)

(72) Inventors: Nam-Gun Kim, Yongin-si (KR); Joonkyu Rhee, Yongin-si (KR); Ji-Hye Lee, Hwaseong-si (KR); Chanmi Lee, Suwon-si (KR); Taeseop Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/405,808

(22) Filed: Jan. 13, 2017

(65) Prior Publication Data
US 2017/0271340 A1    Sep. 21, 2017

(30) Foreign Application Priority Data

Mar. 15, 2016  (KR) .................. 10-2016-0031010

(51) Int. Cl.
*H01L 27/108* (2006.01)
*H01L 29/76* (2006.01)
*H01L 29/94* (2006.01)
*H01L 31/119* (2006.01)
*H01L 21/768* (2006.01)

(52) U.S. Cl.
CPC .... *H01L 27/10814* (2013.01); *H01L 21/7682* (2013.01); *H01L 27/10823* (2013.01); *H01L 27/10855* (2013.01); *H01L 27/10885* (2013.01); *H01L 27/10888* (2013.01)

(58) Field of Classification Search
CPC ......... H01L 27/10855; H01L 27/10885; H01L 27/10814; H01L 27/10823; H01L 21/7682; H01L 23/528; H01L 23/5329
USPC ........ 257/306, 773, 298, 301, 303, E21.649, 257/E27.088, E21.658, E21.657, E27.084
See application file for complete search history.

(56) References Cited

U.S. PATENT DOCUMENTS 8,603,890 B2   12/2013  Purayath et al.
8,999,837 B2    4/2015  Park et al.
9,012,321 B1    4/2015  Kim et al.
(Continued)

FOREIGN PATENT DOCUMENTS

JP  2013197482 A   9/2013
KR  20150015648 A   2/2015
(Continued)

Primary Examiner — Thien F Tran
(74) Attorney, Agent, or Firm — Harness, Dickey & Pierce, P.L.C.

(57) ABSTRACT

Example embodiments relate to a semiconductor device. The semiconductor device includes a substrate including an active region extending in a first direction, a plurality of bit lines running across the active region in a second direction crossing the first direction, a first spacer on a sidewall of the bit line, and a storage node contact on the active region between adjacent bit lines. The first spacer includes a first part between the storage node contact and the bit line, a second part between the first part and the storage node contact, and a third part between the first and second parts. A minimum vertical thickness of the first part is greater than a maximum vertical thickness of the third part. The maximum vertical thickness of the third part is greater than a maximum vertical thickness of the second part.

15 Claims, 46 Drawing Sheets

(56) References Cited

U.S. PATENT DOCUMENTS

| | | |
|---|---|---|
| 9,024,371 B2 | 5/2015 | Lee et al. |
| 9,165,934 B2 | 10/2015 | Choi et al. |
| 9,337,203 B2 | 5/2016 | Hwang et al. |
| 9,356,073 B1 * | 5/2016 | Kim .................... H01L 27/2436 |
| 9,640,426 B2 * | 5/2017 | Rho .................... H01L 21/7682 |
| 2012/0276711 A1 * | 11/2012 | Yoon .................... H01L 21/764 438/421 |
| 2013/0248970 A1 | 9/2013 | Kai et al. |
| 2014/0110816 A1 * | 4/2014 | Kim .................. H01L 27/10855 257/499 |
| 2015/0060988 A1 | 3/2015 | Lee et al. |
| 2015/0126013 A1 | 5/2015 | Hwang et al. |
| 2015/0171163 A1 | 6/2015 | Lee et al. |

FOREIGN PATENT DOCUMENTS

| | | |
|---|---|---|
| KR | 20150041266 A | 4/2015 |
| KR | 20150104337 A | 9/2015 |

* cited by examiner

SEMICONDUCTOR DEVICES

CROSS-REFERENCE TO RELATED APPLICATIONS

This U.S. non-provisional patent application claims priority under 35 U.S.C. § 119 of Korean Patent Application 10-2016-0031010 filed on Mar. 15, 2016, the entire contents of which are hereby incorporated by reference.

BACKGROUND

The example inventive concepts relate to a semiconductor device and/or to a semiconductor device having improved electrical characteristics.

Semiconductor devices are widely used in an electronic industry because of their small size, multi-functional, and/or low manufacture cost. The semiconductor devices have been highly integrated with the development of the electronic industry. Widths and spaces of patterns of the semiconductor devices are being reduced for the high integration of the semiconductor devices. However, new exposure techniques and/or expensive exposure techniques are required for fineness of the patterns such that it is typically challenging to highly integrate the semiconductor devices. Thus, extensive research has recently been conducted directed to improved integration techniques.

SUMMARY

Example embodiments of the inventive concepts relate to a semiconductor device with improved electrical characteristics.

According to some example embodiments of the inventive concepts, a semiconductor may include a substrate including an active region that extends in a first direction, a plurality of bit line structures that run across the active region in a second direction crossing the first direction, a first spacer on a sidewall of each, or at least one, of the bit line structures, and a storage node contact on the active region between the bit line structures adjacent to each other. The first spacer may include a first part between the storage node contact and each, or at least one, of the bit line structures, a second part between the first part and the storage node contact, and a third part between the first part and the second part. A minimum vertical thickness of the first part may be greater than a maximum vertical thickness of the third part. The maximum vertical thickness of the third part may be greater than a maximum vertical thickness of the second part.

According to example embodiments of the inventive concepts, a semiconductor may include a substrate including an active region that extends in a first direction, a plurality of bit line structures that run across the active region in a second direction crossing the first direction, a first spacer on a sidewall of each, or at least one, of the bit line structures, and a storage node contact on the active region between the bit line structures adjacent to each other. The first spacer may include a first part between the storage node contact and each, or at least one, of the bit line structures, a second part between the first part and the storage node contact, the second part having a top surface that is lower than a top surface of the first part, and a third part between the first part and the second part. The third part may include an insulation layer and an air gap surrounded by the insulation layer. The air gap may have a top surface positioned between the top surface of the first part and the top surface of the second part.

According to example embodiments of the present inventive concepts, a semiconductor device may include a substrate including an active region extending in a first direction, a plurality of bit line structures across the active region in a second direction, a spacer on a sidewall of one or more of the bit line structures, a storage node contact on the active region between adjacent bit line structures, a landing pad on the storage node contact in contact with the spacer, the landing pad and the spacer defining a space, and a bottom surface of the space being higher than a top surface of the spacer.

BRIEF DESCRIPTION OF THE DRAWINGS

FIGS. 4A to 18A are plan views illustrating a method for manufacturing a semiconductor device according to example embodiments of the inventive concepts;

FIGS. 4B to 18B are cross-sectional views, taken along lines I-I' and II-II' of FIGS. 4A to 18A, illustrating a method for manufacturing a semiconductor device according to example embodiments of the inventive concepts.

DETAILED DESCRIPTION

Figure 1:
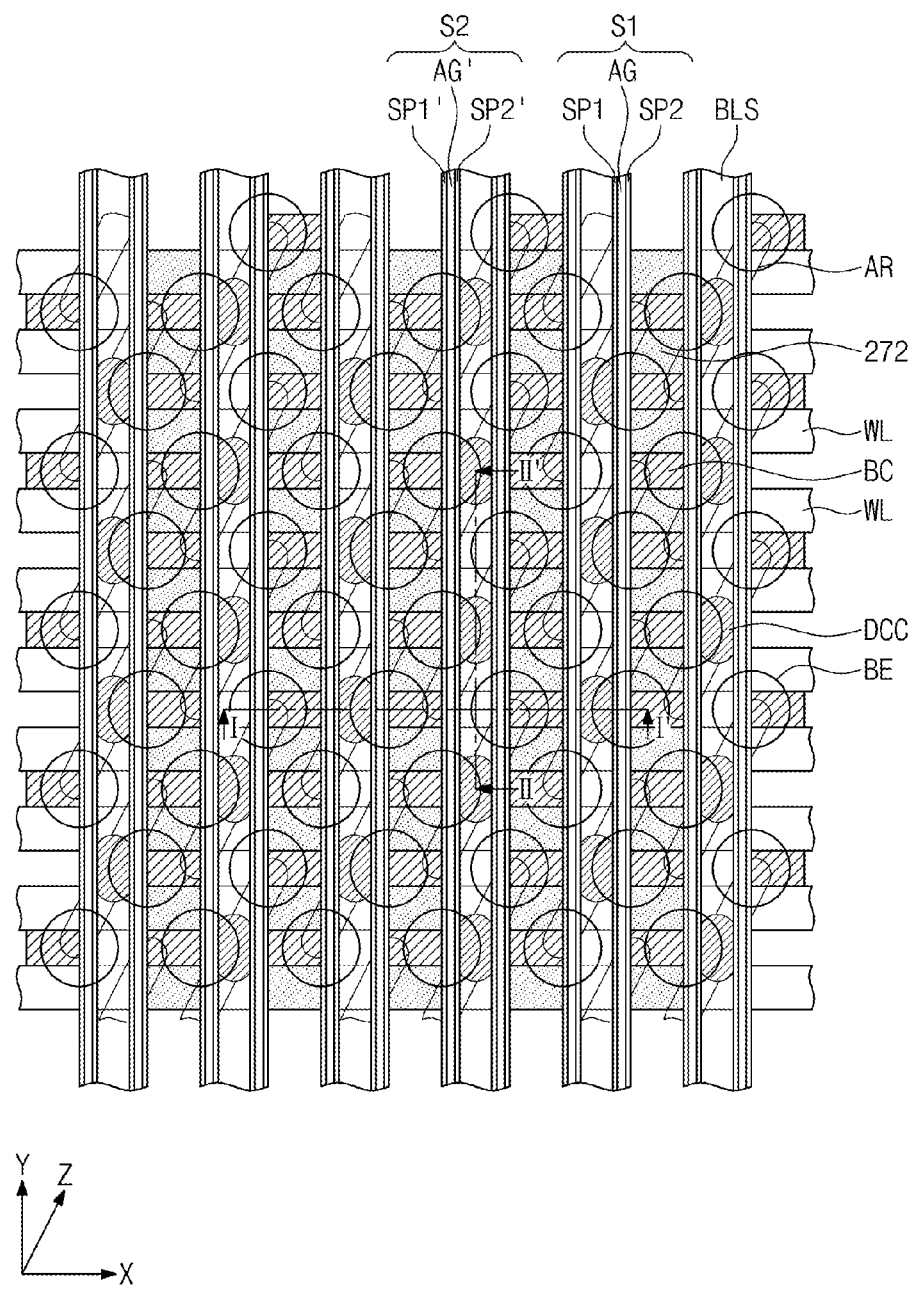
FIG. 1 is a plan view illustrating a semiconductor device according to example embodiments of the inventive concepts.

These and other features and advantages are described in, or are apparent from, the following detailed description of various example embodiments.

In the drawing figures, the dimensions of layers and regions may be exaggerated for clarity of illustration. Like reference numerals refer to like elements throughout. The same reference numbers indicate the same components throughout the specification.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Figure 2A:
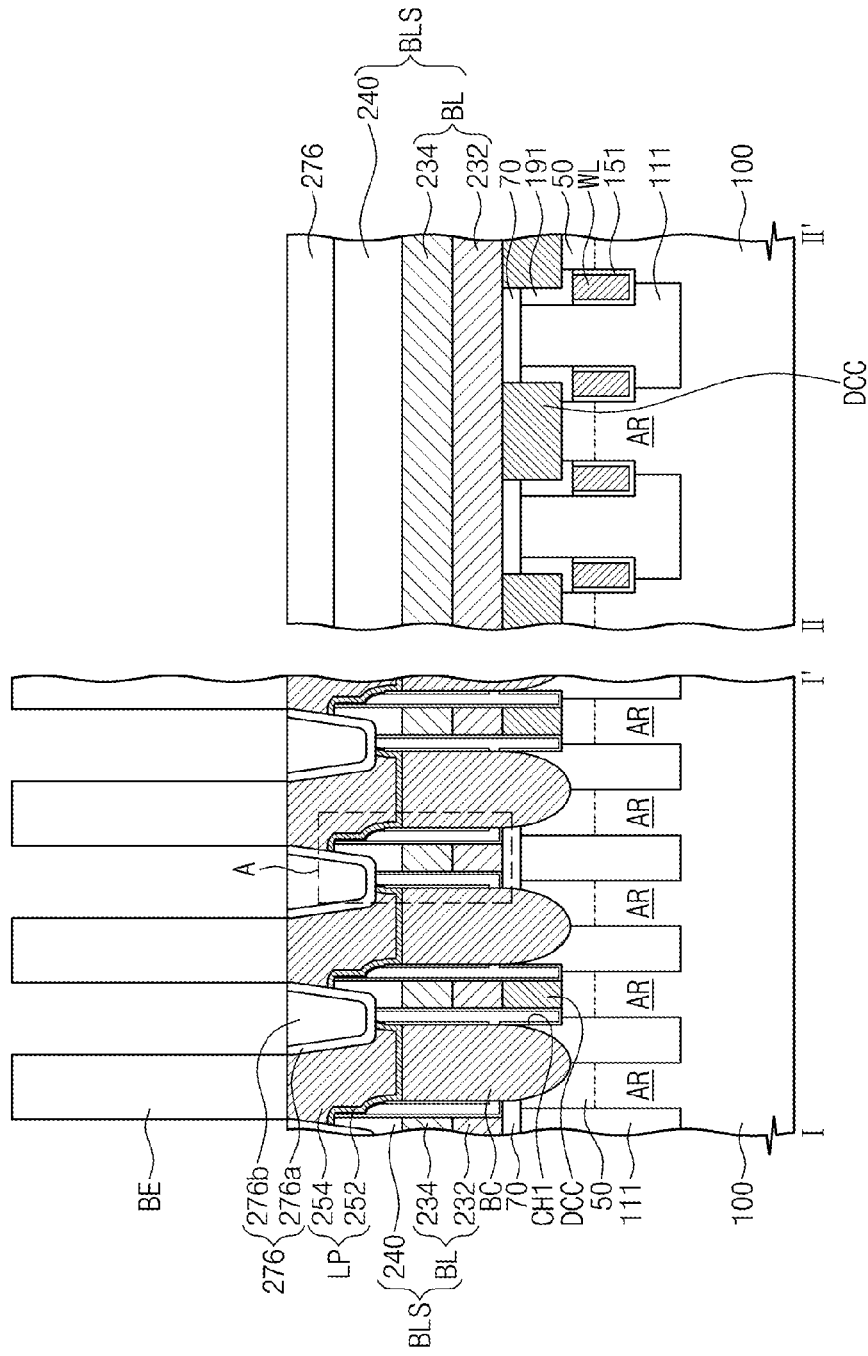
FIG. 2A is a cross-sectional view, taken along lines I-I' and II-II' of FIG. 1, illustrating a semiconductor device according to example embodiments of the inventive concepts.
Figure 2B:
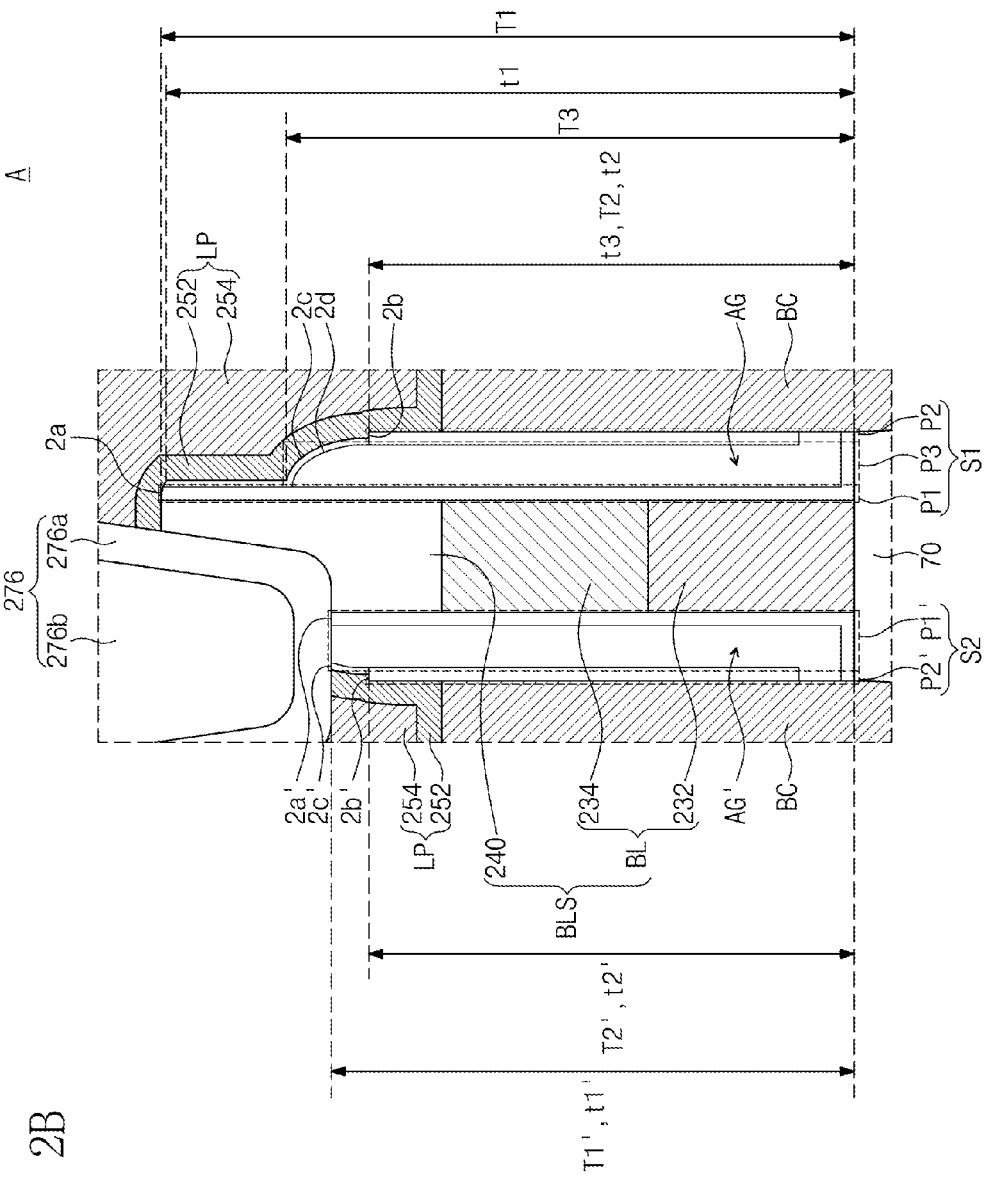
FIGS. 2B and 2C are enlarged views of section A of FIG. 1.
Figure 2C:
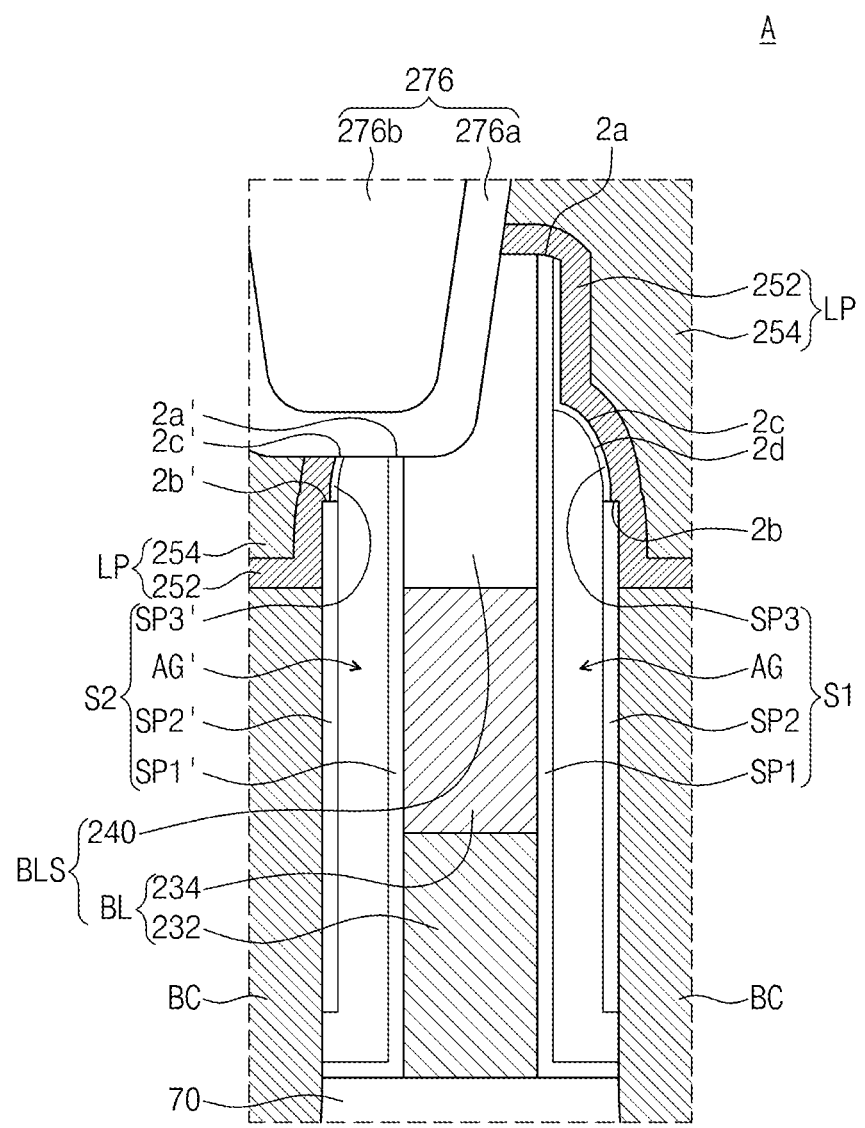
Figure 3A:
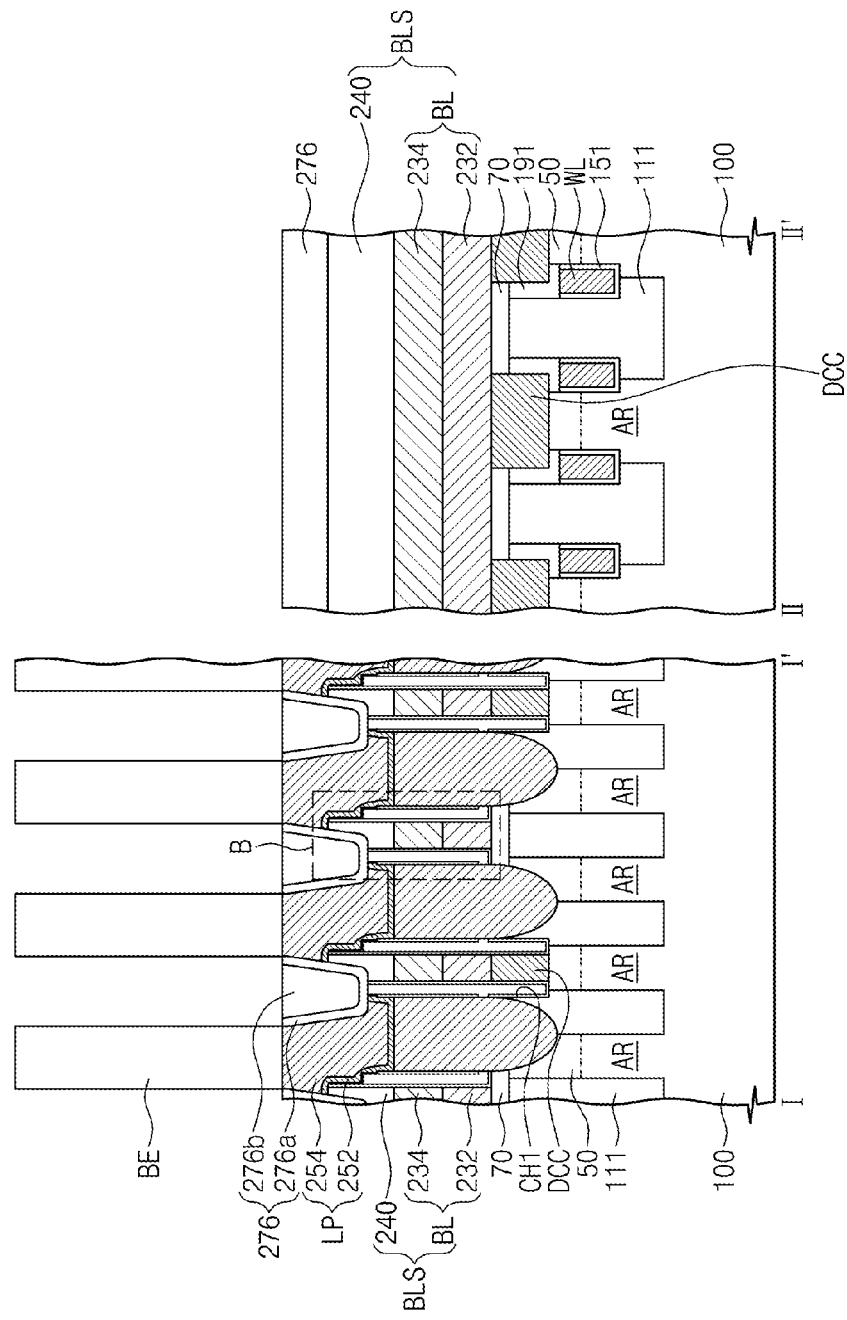
FIG. 3A is a cross-sectional view, taken along lines I-I' and II-II' of FIG. 1, illustrating a semiconductor device according to example embodiments of the inventive concepts.
Figure 3B:
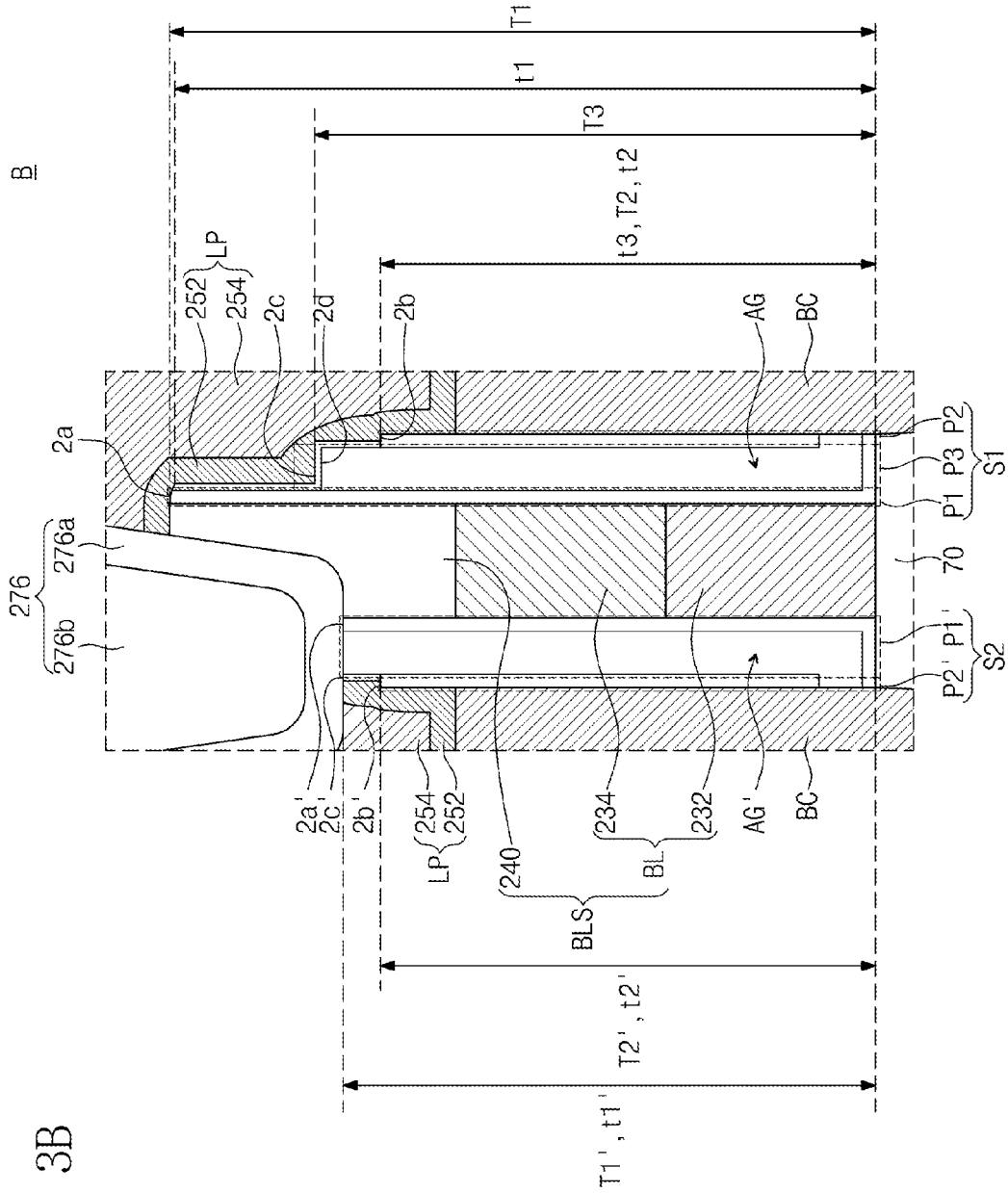
FIGS. 3B and 3C are enlarged views of section B of FIG. 3A.
Figure 3C:
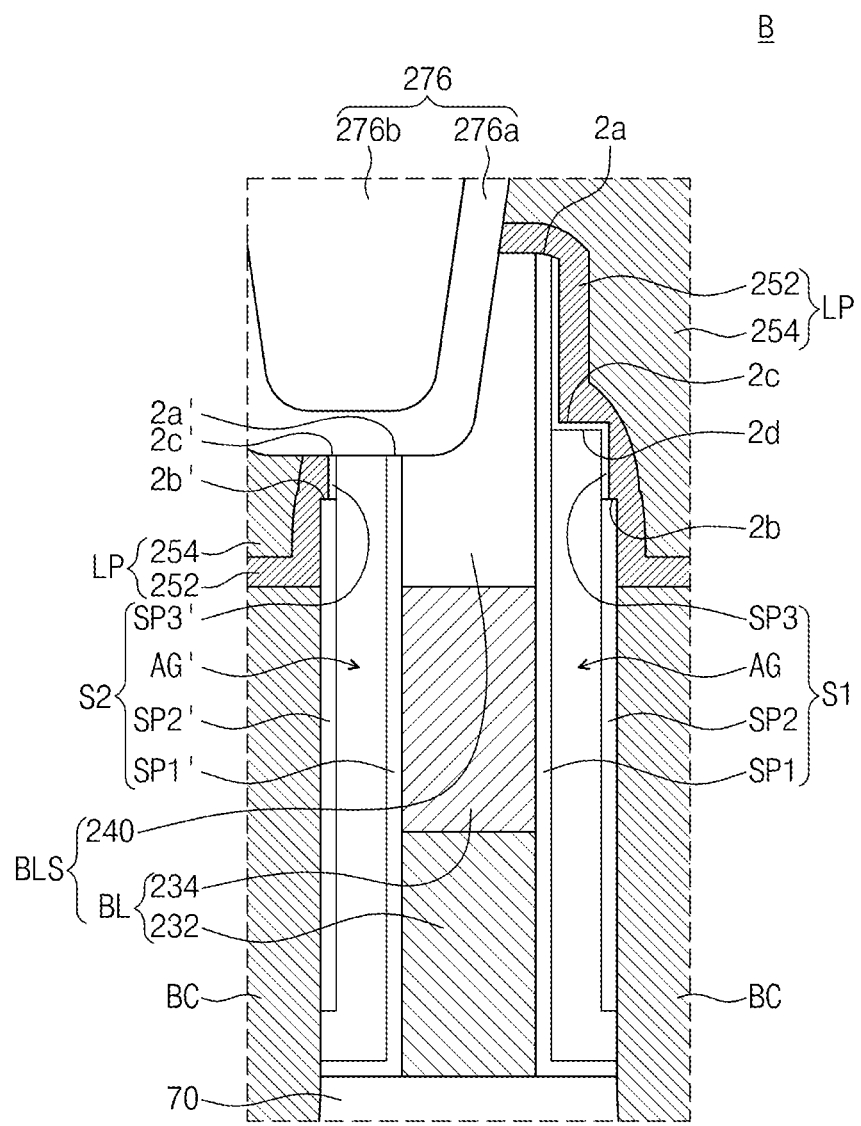

FIG. 1 is a plan view illustrating a semiconductor device according to example embodiments of the inventive concepts. FIG. 2A is a cross-sectional view, taken along lines I-I' and II-II' of FIG. 1, illustrating a semiconductor device according to example embodiments of the inventive concepts. FIGS. 2B and 2C are enlarged views of section A of FIG. 1. FIG. 3A is a cross-sectional view, taken along lines I-I' and II-II' of FIG. 1, illustrating a semiconductor device according to example embodiments of the inventive concepts. FIGS. 3B and 3C are enlarged views of section B of FIG. 3A.

Referring to FIGS. 1 and 2A, a device isolation layer 111 may be disposed in a substrate 100. The substrate 100 may be a bulk silicon substrate, a silicon-on-insulator (SOI) substrate, a germanium substrate, a germanium-on-insulator (GOI) substrate, a silicon-germanium substrate, or an epitaxial layered substrate obtained by performing a selective epitaxial growth (SEG) technique.

The device isolation layer 111 may include an insulative material (e.g., silicon oxide). The device isolation layer 111 may define active regions AR of the substrate 100. The active regions AR may have a bar shape elongated in a third direction Z. The active regions AR may be substantially parallel to each other.

A source/drain region 50 may be disposed in each, or at least one, active region AR of the substrate 100. The source/drain region 50 may have a conductivity (e.g., n-type) that is different from the conductivity of the substrate 100.

A pair of word lines WL may be disposed in each, or at least one, active region AR of the substrate 100. The word lines WL may run across the active region AR in a first direction X crossing the third direction Z. The word lines WL may be buried in the active region AR of the substrate 100. In other words, the word lines WL may have top surfaces that are lower than a top surface of the substrate 100. The word lines WL may be formed of or include a conductive material including, for example, polysilicon, doped polysilicon, metal, or metal silicide.

A gate dielectric layer 151 may be disposed between the substrate 100 and opposing sidewalls of the word line WL and between the substrate 100 and a bottom surface of the word line WL. The gate dielectric layer 151 may include, for example, a silicon oxide layer or a thermal oxide layer.

A capping pattern 191 may be disposed between the top surface of the word line WL and the top surface of the substrate 100. The capping pattern 191 may have a top surface flush with the top surface of the substrate 100. The capping pattern 191 may also have a bottom surface in contact with the top surface of the word line WL and a top surface of the gate dielectric layer 151. The capping pattern 191 may include an insulative material (e.g., silicon oxide).

A buffer layer 70 may be disposed on the top surface of the substrate 100. The buffer layer 70 may include one or more insulation layers. For example, the buffer layer 70 may include a silicon oxide layer, a silicon nitride layer, a silicon oxynitride layer, or a plurality of insulation layers including at least two thereof.

A bit line node contact DCC may be disposed in the active region AR between a pair of the word lines WL. The bit line node contact DCC may penetrate the buffer layer 70 and be electrically connected to the source/drain region 50 disposed in the active region AR. The bit line node contact DCC may have a bottom surface that is higher than the top surface of the word line WL and a top surface that is coplanar with a top surface of the buffer layer 70. The bit line node contact DCC may include at least one of, for example, a metal silicide layer, a poly silicide layer, a metal nitride layer, and a metal layer.

A bit line structure BLS may be disposed to run across the active region AR of the substrate 100 in a second direction Y crossing the first and third directions X and Z. The bit line structure BLS may run across on a plurality of the bit line node contacts DCC arranged in the second direction Y. For example, the bit line structure BLS may be electrically connected to the plurality of the bit line node contacts DCC arranged in the second direction Y.

The bit line structure BLS may include a bit line BL and an insulative pattern 240 that are stacked, for example sequentially stacked on the substrate 100. The bit line BL may include a first conductive pattern 232 and a second conductive pattern 234. The second conductive pattern 234 may be disposed between the first conductive pattern 232 and the insulative pattern 240. The first conductive pattern 232 may include, for example, polysilicon or doped polysilicon. The second conductive pattern 234 may include, for example, at least one of tungsten (W), aluminum (Al), copper (Cu), nickel (Ni), and cobalt (Co). The insulative pattern 240 may include, for example, a silicon oxide layer. Although not shown in figures, a diffusion barrier layer may be disposed between the first conductive pattern 232 and the second conductive pattern 234.

A storage node contact BC may be disposed on the active region AR between the bit line structures BLS that are adjacent to each other. The storage node contact BC may be electrically connected to the source/drain region 50 disposed in the active region AR of the substrate 100. For example, a plurality of storage node contacts BC may be arranged, for example linearly arranged along the second direction Y. The storage node contact BC may have a lower portion that is buried in the active region AR of the substrate 100. The storage node contact BC may also have a top surface that is lower than a top surface of the insulative pattern 240. The storage node contact BC may include at least one of, for example, a metal silicide layer, a polysilicon layer, a metal nitride layer, and a metal layer.

Referring to FIGS. 2A and 2B, first and second spacers S1 and S2 may be disposed on sidewalls of each, or at least one, of the bit line structures BLS. In detail, the first spacer S1 may be disposed on one sidewall of the bit line structure BLS, and the second spacer S2 may be disposed on opposite sidewall of the bit line structure BLS. For example, the first and second spacers S1 and S2 may face each other with the storage node contact BC interposed therebetween. The first and second spacers S1 and S2 may have upper portions that are exposed from the storage node contact BC. The first and second spacers S1 and S2 will be further discussed in detail later.

As shown in FIG. 1, a separation pattern 272 may be disposed on the buffer layer 70 and on an intersection where the word line WL crosses an area between adjacent bit line structures BLS. The separation pattern 272 may include at least one of, for example, a SiBCN layer, a SiCN layer, a SiOCN layer, and a SiN layer.

A landing pad LP may be disposed on the storage node contact BC. The landing pad LP may be electrically connected to the storage node contact BC. A portion of the landing pad LP may be disposed on one of the bit line structures BLS that are adjacent to each other. For example, the landing pad LP may have a top surface flush with a top surface of the separation pattern 272.

The landing pad LP may include a barrier pattern 252 and a metal pattern 254 that are stacked, for example sequentially stacked on the storage node contact BC. The barrier pattern 252 may be interposed between the metal pattern 254 and the storage node contact BC, between the metal pattern 254 and an upper portion of the first spacer S1, between the metal pattern 254 and the top surface of the insulative pattern 240, and between the metal pattern 254 and the upper portion of the second spacer S2. The barrier pattern 252 may include, for example, TiN, Ti/TiN, TiSiN, TaN or WN. The metal pattern 254 may include a metallic material (e.g., tungsten).

A separation layer 276 may be disposed between the landing pads LP that are adjacent to each other. The separation layer 276 may wrap outer sidewalls of the landing pads LP. The separation layer 276 may have a bottom surface between top and bottom surfaces of the insulative pattern 240. For example, a portion of the separation layer 276 may be buried in the insulative pattern 240 adjacent to the second spacer S2. The bottom surface of the separation layer 276 may be at least in partial contact with the second spacer S2. The separation layer 276 may also have a top surface coplanar with the top surface of the landing pad LP.

The separation layer 276 may include a first insulation layer 276a and a second insulation layer 276b. The first insulation layer 276a may be in contact with the outer sidewalls of the landing pads LP that are adjacent to each other, a portion of a sidewall of the insulative pattern 240, and the second spacer S2. The first insulation layer 276a may include an insulative material whose step coverage is poor. The first insulation layer 276a may include, for example, a tetraethylorthosilicate (TEOS) layer or a high plasma density (HDP) layer. The second insulation layer 276b may be disposed within an inner space surrounded by the first insulation layer 276a. The second insulation layer 276b may include, for example, a silicon oxide layer or a silicon nitride layer.

Information storage elements may be disposed on the landing pads LP. The information storage elements may include a capacitor. The capacitor may include a bottom electrode BE, a dielectric layer (not shown), and a top electrode (not shown). For example, a plurality of the bottom electrodes BE may be arranged zigzag along the second direction Y.

Hereinafter, the first and second spacers S1 and S2 are discussed in detail with reference to FIGS. 2B, 2C, 3B and 3C.

Referring to FIG. 2B, the first spacer S1 may include a first part P1 adjacent to the bit line structure BLS, a second part P2 adjacent to the storage node contact BC, and a third part P3 adjacent to the landing pad LP. The first part P1 of the first spacer S1 may be interposed between the storage node contact BC and a portion of the bit line structure BLS and between the landing pad LP and other portion of the bit line structure BLS. The second part P2 of the first spacer S1 may be interposed between the storage node contact BC and a portion of the first part P1 and between the landing pad LP and other portion of the first part P1. The third part P3 of the first spacer S1 may be interposed between the first part P1 and the second part P2.

For example, a minimum vertical thickness t1 of the first part P1 may be greater than a maximum vertical thickness T3 of the third part P3, and the maximum vertical thickness T3 of the third part P3 may be greater than a maximum vertical thickness T2 of the second part P2. A minimum vertical thickness t3 of the third part P3 may be substantially the same as the maximum vertical thickness T2 of the second part P2. The first part P1 may include a first insulation layer, the second part P2 may include a second insulation layer, and the third part P3 may include a third insulation layer and an air gap surrounded by the third insulation layer.

A top surface 2a of the first part P1 may be higher than a top surface 2b of the second part P2, and a top surface 2c of the third part P3 may be positioned between the top surface 2a of the first part P1 and the top surface 2b of the second part P2. For example, a top surface 2d of the air gap AG may be positioned between the top surface 2a of the first part P1 and the top surface 2b of the second part P2. The top surface 2b of the second part P2 may be higher than the top surface of the storage node contact BC. The top surfaces 2a to 2c of the first to third parts P1 to P3 may be in contact with the landing pad LP. The top surface 2c of the third part P3 may be exposed between the first and second parts P1 and P2. For example, the third part P3 may have an upper portion including the top surface 2c, and the upper portion of the third part P3 may have a rounded corner.

The second spacer S2 may include a first part P1' adjacent to the bit line structure BLS, a second part P2' adjacent to the storage node contact BC, and an air gap AG' between the first and second parts P1' and P2'. The first part P1' of the second spacer S2 may be interposed between the storage node contact BC and a portion of the bit line structure BLS and between the landing pad LP and other portion of the bit line structure BLS. The second part P2' of the second spacer S2 may be interposed between the storage node contact BC and a portion of the first part P1' and between the landing pad LP and other portion of the bit line structure BLS.

For example, a minimum vertical thickness t1' of the first part P1' may be greater than a maximum vertical thickness T2' of the second part P2'. A maximum vertical thickness T1' of the first part P1' may be substantially the same as the minimum vertical thickness t1' of the first part P1', and the maximum vertical thickness T2' of the second part P2' may be substantially the same as a minimum vertical thickness t2' of the second part P2'.

Referring to FIG. 2C, the first spacer S1 may include a first sub-spacer SP1, a second sub-spacer SP2, a third sub-spacer SP3, and the air gap AG. The first sub-spacer SP1 may be disposed between the bit line BL and the storage node contact BC and between a portion of the insulative pattern 240 and a portion of the landing pad LP. The first sub-spacer SP1 may extend onto the top surface of the buffer layer 70 and/or, as shown in FIG. 2A, the top surface of the substrate 100 exposed through a first contact hole CH1. For example, one or more of a plurality of first sub-spacers SP1 may be in contact with a sidewall of the bit line BL, a sidewall of the insulative pattern 240, a portion of the barrier pattern 252, and the top surface of the buffer layer 70. Another one or more of the plurality of first sub-spacers SP1 may be in contact with a sidewall of the bit line BL, a sidewall of the insulative pattern 240, a portion of the barrier pattern 252, and the top surface of the substrate 100 exposed through the first contact hole CH1.

The second sub-spacer SP2 may be disposed between a portion of the first sub-spacer SP1 and a portion of the storage node contact BC and between other portion of the first sub-spacer SP1 and a portion of the landing pad LP adjacent to the storage node contact BC. For example, the second sub-spacer SP2 may be in contact with a portion of a sidewall of the storage node contact BC and a portion of the landing pad LP. As shown in FIG. 2B, the second sub-spacer SP2 may have a top surface corresponding to the top surface 2*b* of the second part P2 included in the first spacer S1, and the first sub-spacer SP1 may have a top surface corresponding to the top surface 2*a* of the first part P1 included in the first spacer S1. The top surface 2*b* of the second sub-spacer SP2 may be lower than the top surface 2*a* of the first sub-spacer SP1. The second sub-spacer SP2 may include, for example, a silicon nitride layer.

The sub-third spacer SP3 may be disposed between an upper sidewall of the first sub-spacer SP1 and the top surface 2*b* of the second sub-spacer SP2. For example, the third sub-spacer SP3 may be in contact with the upper sidewall of the first sub-spacer SP1, a portion of the top surface 2*b* of the second sub-spacer SP2, and a portion of the landing pad LP. The third sub-spacer SP3 may be disposed on the top surface of the storage node contact BC. In other words, the third sub-spacer SP3 may be exposed from the storage node contact BC. The third sub-spacer SP3 may have a thickness that is less than a thickness of the second sub-spacer SP2. The third sub-spacer SP3 may include, for example, a silicon nitride layer.

The air gap AG may be disposed between the bit line BL and the storage node contact BC and between the landing pad LP and a portion of the insulative pattern 240. The air gap AG may correspond to a hollow space surrounded by the first sub-spacer SP1, the second sub-spacer SP2, the third sub-spacer SP3, and a portion of the storage node contact BC which is exposed between the first and second sub-spacers SP1 and SP2. For example, the top surface 2*d* of the air gap AG may be positioned between the top surface 2*a* of the first sub-spacer SP1 and the top surface 2*b* of the second sub-spacer SP2.

The second sub-spacer SP2 may include a first sub-spacer SP1', a second sub-spacer SP2', a third sub-spacer SP3', and the air gap AG'. The first sub-spacer SP1' may be disposed between the bit line BL and the storage node contact BC and between the landing pad LP and a portion of the insulative pattern 240. The first sub-spacer SP1' may extend onto the top surface of the buffer layer 70 and/or, as shown in FIG. 2A, the top surface of the substrate 100 exposed through the first channel hole CH1. For example, one or more of a plurality of first sub-spacers SP1' may be in contact with other sidewall of the bit line BL, other sidewall of the insulative pattern 240, a portion of a bottom surface of the first insulation layer 276*a*, and the top surface of the buffer layer 70. Another one or more of the plurality of first sub-spacers SP1' may be in contact with other sidewall of the bit line BL, other sidewall of the insulative pattern 240, a portion of a bottom surface of the first insulation layer 276*a*, and the top surface of the substrate 100 exposed through the first contact hole CH1. The first sub-spacer SP1' may include, for example, a silicon nitride layer.

The second sub-spacer SP2' may be disposed between a portion of the first sub-spacer SP1' and a portion of the storage node contact BC and between other portion of the first sub-spacer SP1' and a portion of the landing pad LP adjacent to the storage node contact BC. For example, the second sub-spacer SP2' may be at least in partial contact with a sidewall of the storage node contact BC and the landing pad LP. For example, the second sub-spacer SP2' may have a top surface 2*b*' that is lower than a top surface 2*a*' of the first sub-spacer SP1'. The second sub-spacer SP2' may include, for example, a silicon nitride layer.

The third sub-spacer SP3' may be disposed between the top surface 2*b*' of the second sub-spacer SP2' and a portion of a bottom surface of the first insulation layer 276*a*. For example, the third sub-spacer SP3' may be at least in partial contact with the top surface 2*b*' of the second sub-spacer SP2', the landing pad LP, and the bottom surface of the first insulation layer 276*a*. The third sub-spacer SP3' may include, for example, a silicon nitride layer.

The air gap AG' may be disposed between the bit line BL and the storage node contact BC and between a portion of the insulative pattern 240 and a portion of the landing pad LP. The air gap AG' may correspond to a hollow space surrounded by the first sub-spacer SP1', the second sub-spacer SP2', the third sub-spacer SP3', a portion of the first insulation layer 276*a*, and a portion of the storage node contact BC which is exposed between the first and second sub-spacers SP1' and SP2'.

The first spacer S1 may have a topmost surface which is defined by the top surface 2*a* of the first sub-spacer SP1. The second spacer S2 may have a topmost surface which is defined by the top surface 2*a*' of the first sub-spacer SP1', the top surface 2*c*' of the third sub-spacer SP3', and a portion of the bottom surface of the first insulation layer 276*a*. The topmost surface of the first spacer S1 may be positioned at a level that is different from the level of the topmost surface of the second spacer S2. For example, the topmost surface of the first spacer S1 may be higher than the topmost surface of the second spacer S2.

Referring to FIGS. 3A and 3B, the third part P3 of the first spacer S1 may have an upper portion including the top surface 2*c*, and the upper portion of the third part P3 may have an angulated corner. Except for the angulated shaped of the third part 3, a description discussed with reference to FIGS. 2A and 2B may also be identically or similarly applicable to this embodiment and thus the repetitive description will be omitted for brevity.

FIGS. 4A to 18A are plan views illustrating a method for manufacturing a semiconductor device according to example embodiments of the inventive concepts. FIGS. 4B to 18B are cross-sectional views, taken along lines I-I' and II-IF of FIGS. 4A to 18A, illustrating a method for manufacturing a semiconductor device according to example embodiments of the inventive concepts.

Figure 4A:
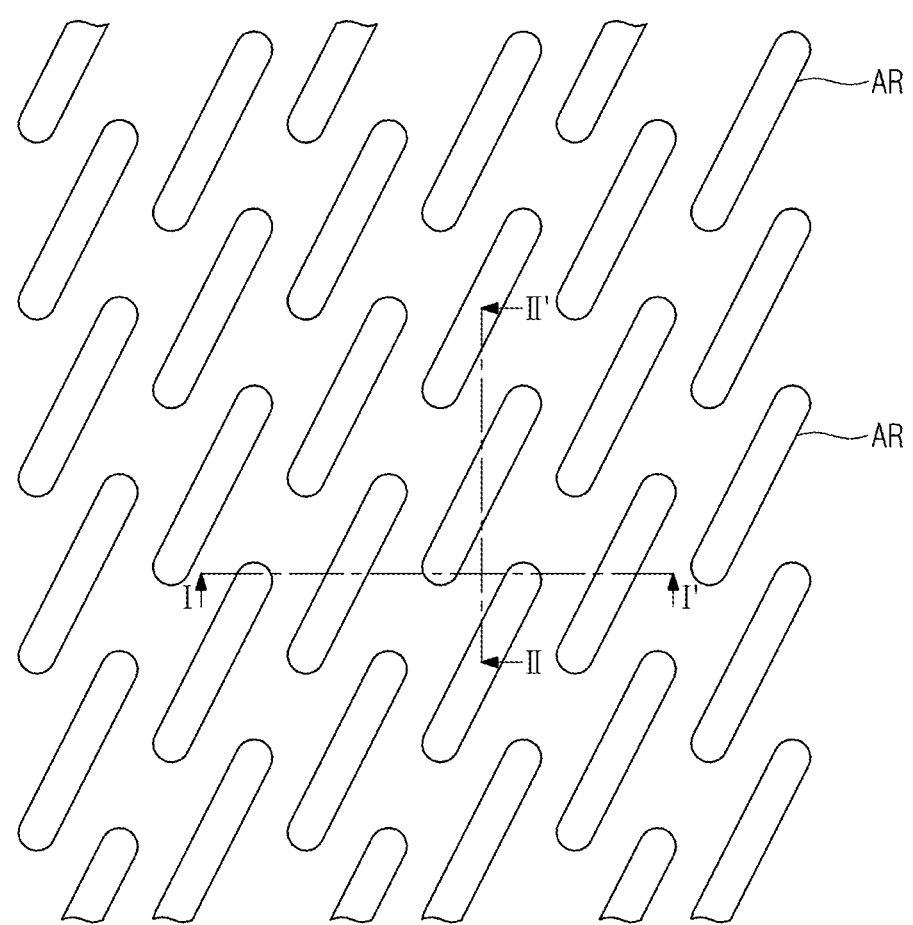
Figure 4B:
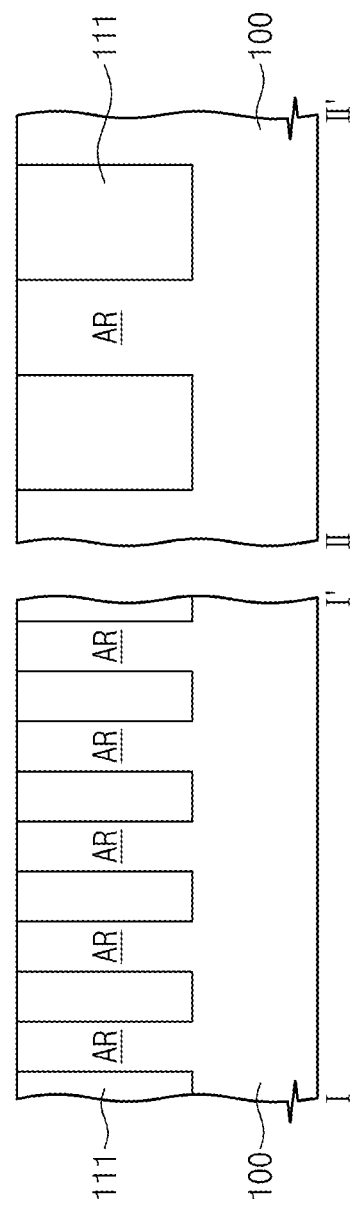

Referring to FIGS. 4A and 4B, active regions AR may be defined by forming a device isolation layer 111 in a substrate 100. The device isolation layer 111 may be formed by forming trenches (not shown) in the substrate 100 and filling the trenches with an insulative material. The active regions AR may have a bar shape elongated in a third direction Z and be disposed substantially in parallel to each other. The substrate 100 may be a bulk silicon substrate, a silicon-on-insulator (SOI) substrate, a germanium substrate, a germanium-on-insulator (GOI) substrate, a silicon-germanium substrate, or an epitaxial layered substrate obtained by performing a selective epitaxial growth (SEG) technique. The device isolation layer 111 may include, for example, silicon oxide, silicon nitride, or silicon oxynitride.

Figure 5A:
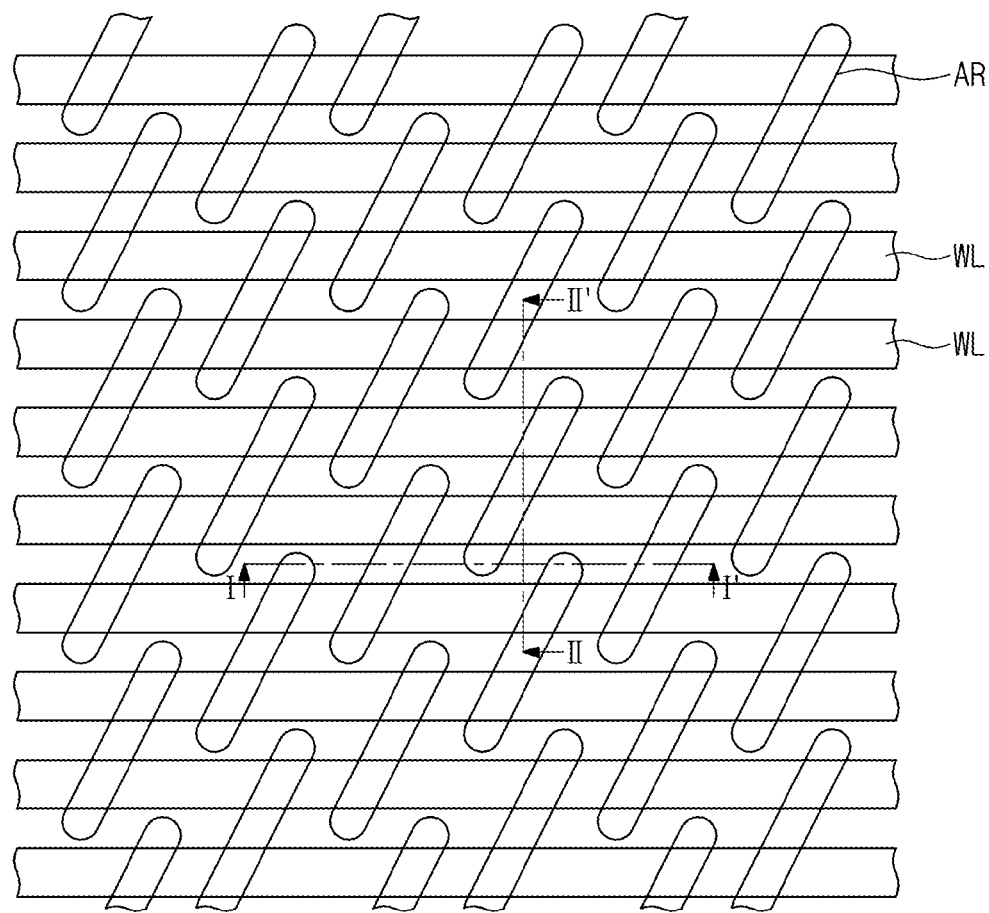
Figure 5B:
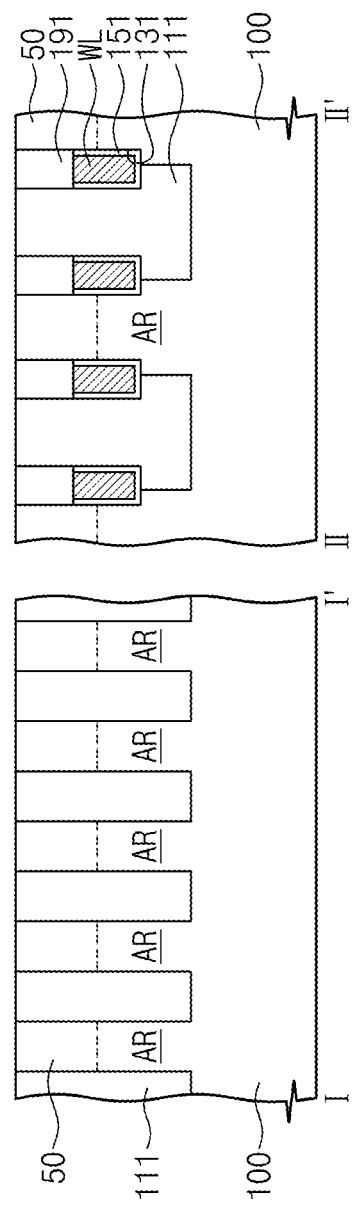

Referring to FIGS. 5A and 5B, a source/drain region 50 may be formed in each, or at least one, of the active regions AR. The source/drain region 50 may be formed by forming an ion implantation mask (not shown) on the substrate 100 and performing an ion implantation on portions of the substrate 100 that are exposed through the ion implantation mask. Alternatively, the ion implantation may be performed without the ion implantation mask.

Trenches 131 may be formed in the substrate 100. A pair of the trenches 121 may be formed to run across the active region AR in a first direction X crossing the third direction Z. The trenches 131 may be arranged substantially in parallel to each other.

A gate dielectric layer 151 may be formed to conformally cover a surface of each, or at least one, of the trenches 131. The gate dielectric layer 151 may be formed of or include an insulative material such as, for example, a silicon oxide layer or a thermal oxide layer.

A word line WL may be formed within the trench 131 in which the gate dielectric layer 151 is formed. The word line WL may be formed by forming on the gate dielectric layer 151a metal layer (not shown) to fill the trench 131 and performing an etch process on the metal layer to leave a portion of the metal layer in a lower portion of the trench 131. The word line WL may be formed of or include a conductive material including, for example, polysilicon, doped poly silicon, metal, or metal silicide.

A capping pattern 191 may be formed in the rest space of the trench 131. The capping pattern 191 may be formed on the word line WL and completely fill the trench 131. The capping pattern 191 may include, for example, silicon oxide, silicon nitride, or silicon oxynitride.

Figure 6A:
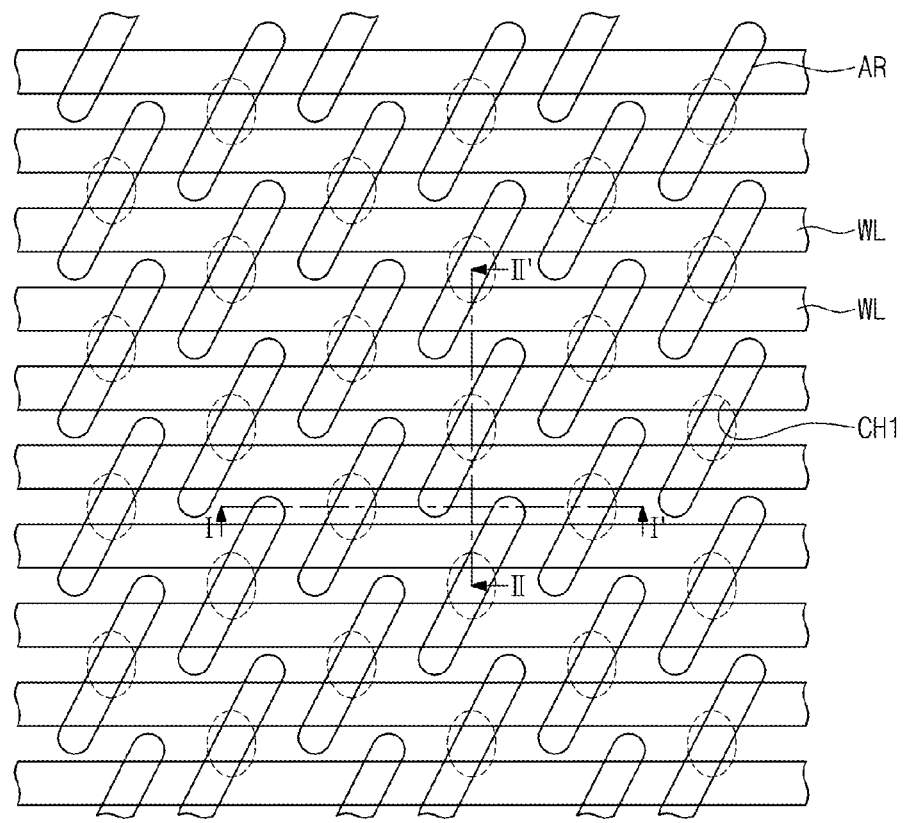
Figure 6B:
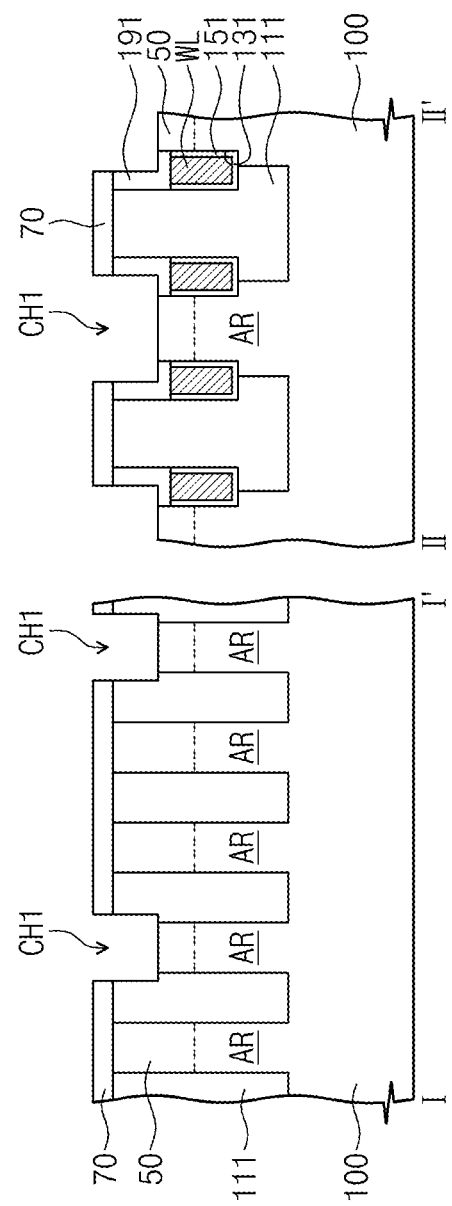

Referring to FIGS. 6A and 6B, a buffer layer 70 may be formed on the substrate 100. The buffer layer 70 may include one or more insulation layers. For example, the buffer layer 70 may include a silicon oxide layer, a silicon nitride layer, a silicon oxynitride layer, or a plurality of insulation layers including at least two thereof. Although not shown in figures, a mask pattern having openings may be formed on the buffer layer 70.

The buffer layer 70 may be patterned by an etch process using the mask pattern (not shown) as an etch mask. The etch process may at least partially etch the buffer layer 70 and the substrate 100 to form a first contact hole CH1 in the active region AR. In detail, as viewed in plan, the first contact hole CH1 may expose the source/drain region 50 disposed between a pair of the word lines WL that overlap the active region AR. When the first contact hole CH1 is formed, the etch process may at least partially etch an upper portion of the device isolation layer 111 which is adjacent to the source/drain region 50.

Figure 7A:
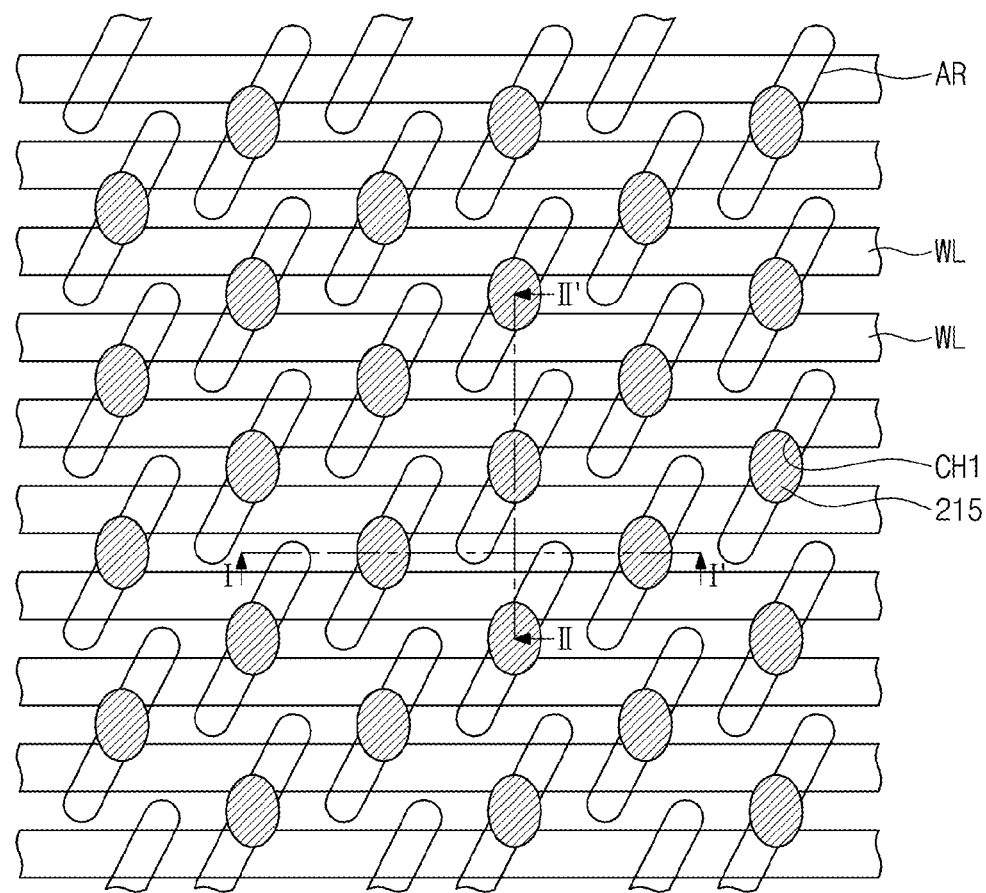
Figure 7B:
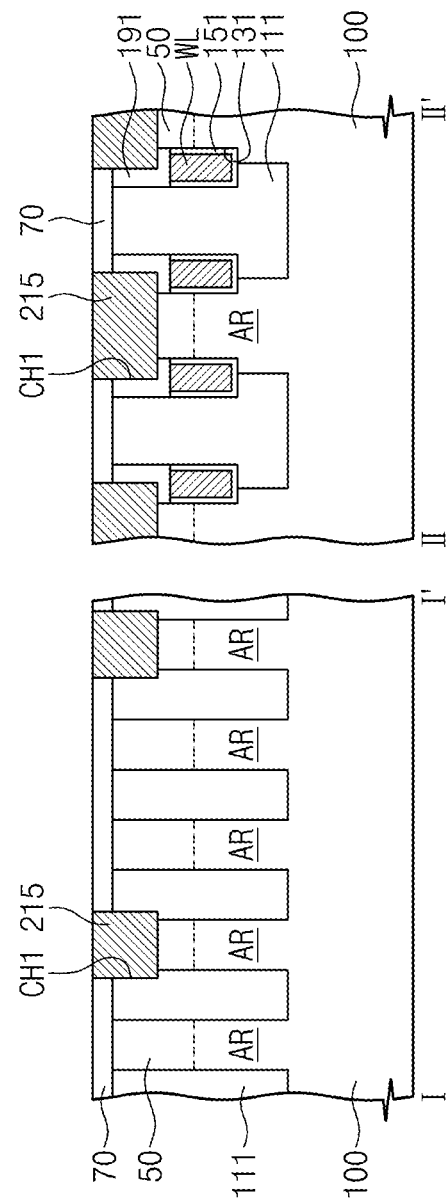

Referring to FIGS. 7A and 7B, a contact pattern 215 may be formed within the first contact hole CH1. The contact pattern 215 may be formed to completely fill the first contact hole CH1. In detail, the contact pattern 215 may be formed by forming on the buffer layer 70 a conductive layer (not shown) to fill the first contact hole CH1 and performing a planarization process (e.g., CMP or etch-back) on the conductive layer until a top surface of the buffer layer 70 is revealed. The contact pattern 215 may include at least one of a metal silicide layer, a poly silicide layer, a metal nitride layer, and a metal layer.

Figure 8A:
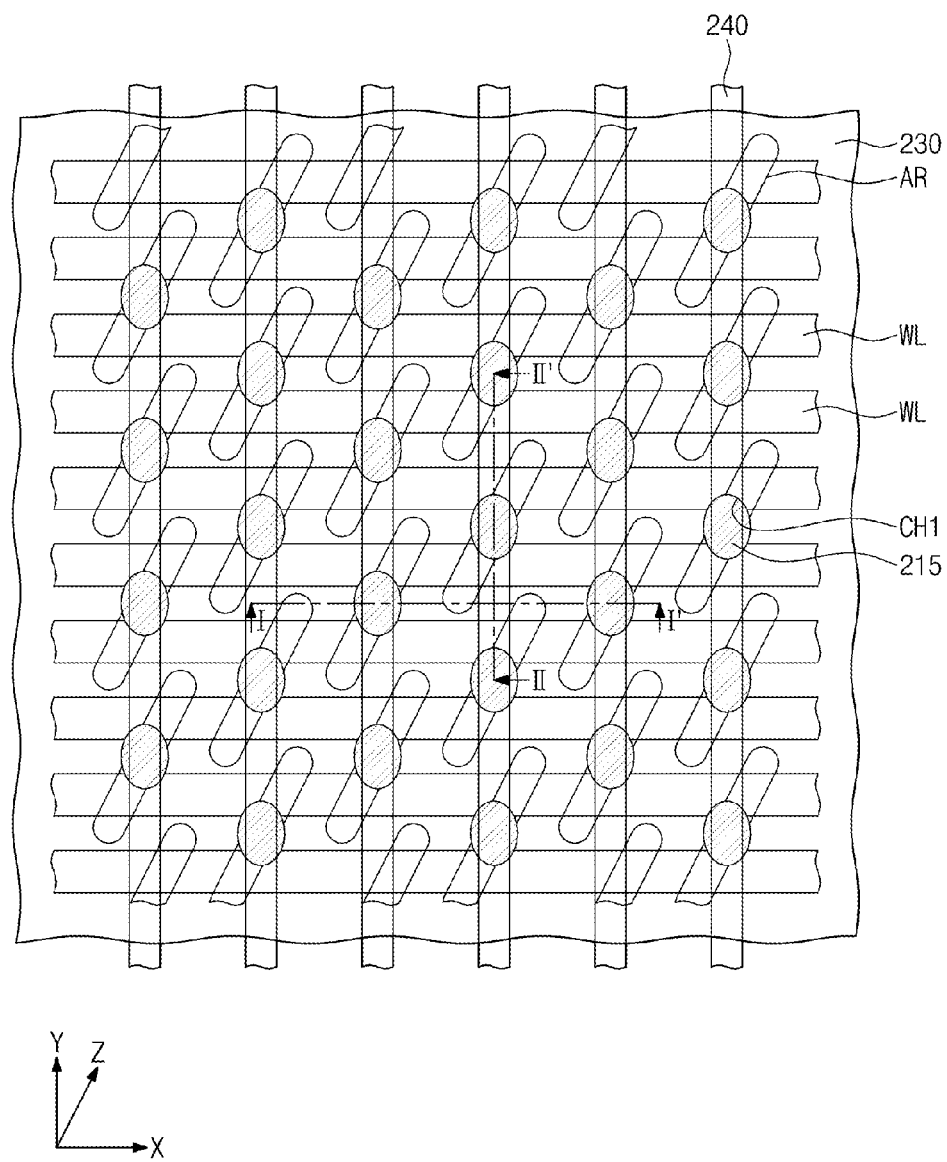
Figure 8B:
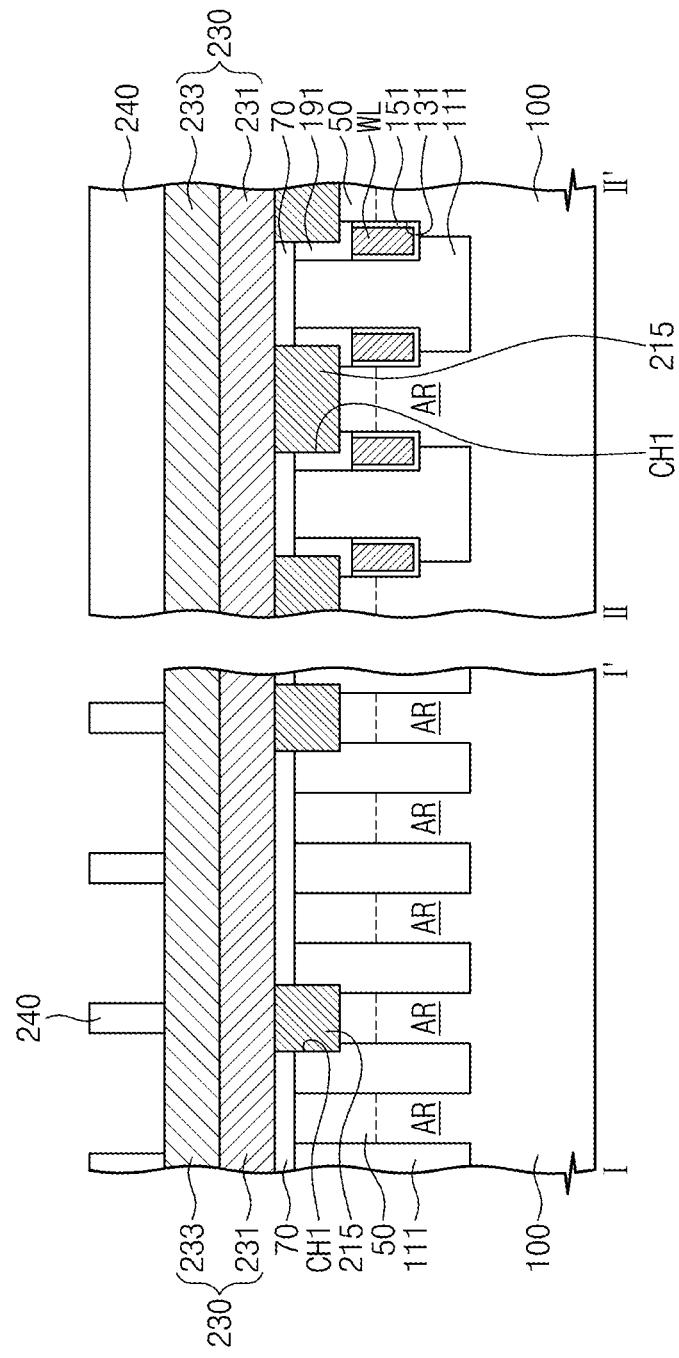

Referring to FIGS. 8A and 8B, an electrode layer 230 may be formed on the buffer layer 70. The electrode layer 230 may include a plurality of conductive layers. For example, the electrode layer 230 may include a first electrode layer 231 and a second electrode layer 233 stacked, for example sequentially stacked on the buffer layer 70. The first electrode layer 231 may include, for example, polysilicon or doped polysilicon. The second electrode layer 233 may include, for example, tungsten (W), aluminum (Al), copper (Cu), nickel (Ni), or cobalt (Co). Although not shown in figures, a diffusion barrier layer may be interposed between the first and second electrode layers 231 and 233. The diffusion barrier layer may include a diffusion barrier metal including, for example, TiN, Ti/TiN, TiSiN, TaN, or WN.

An insulative pattern 240 may be formed on the electrode layer 230. A plurality of the insulative patterns 240 may be provided to extend substantially in parallel to each other in a second direction Y crossing the first and third directions X and Z. Each, or at least one, of the insulative patterns 240 may run across the active regions AR so as to pass on the contact patterns 215 arranged in the second direction Y. The insulative pattern 240 may include silicon oxide or silicon nitride.

Figure 9A:
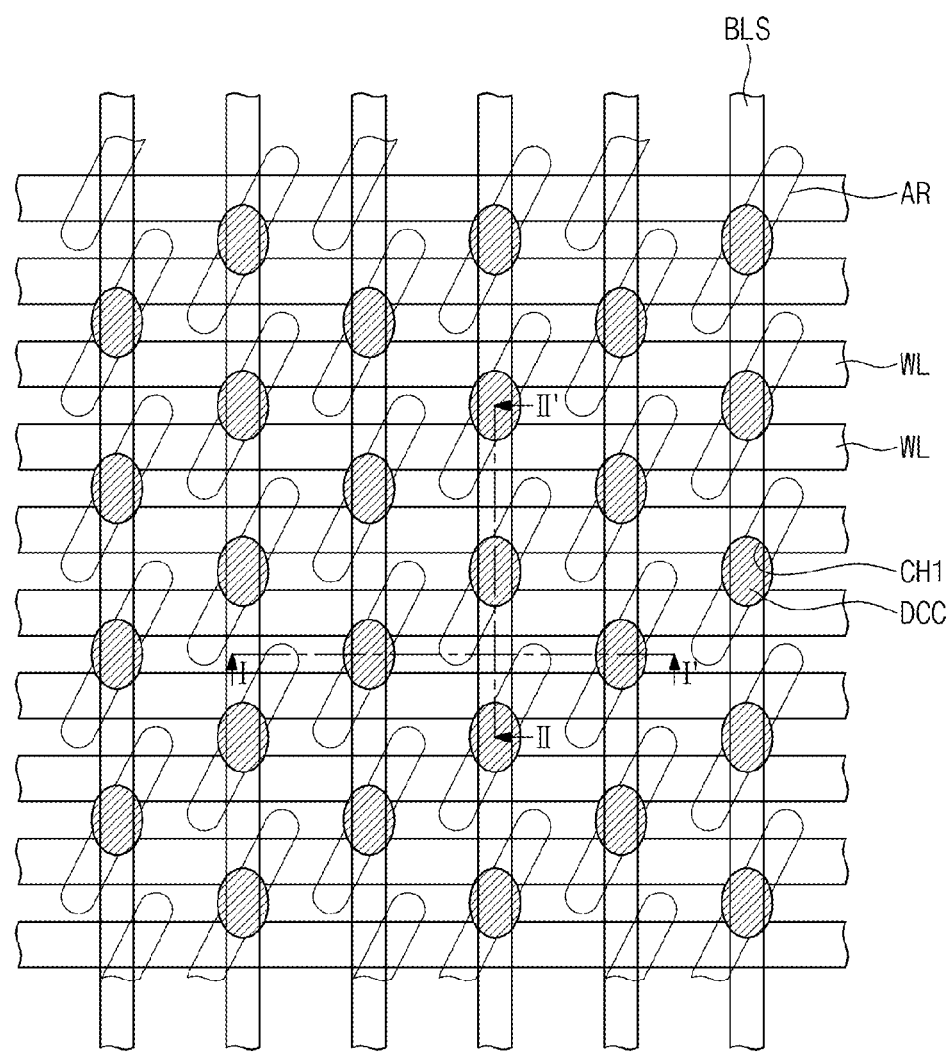
Figure 9B:
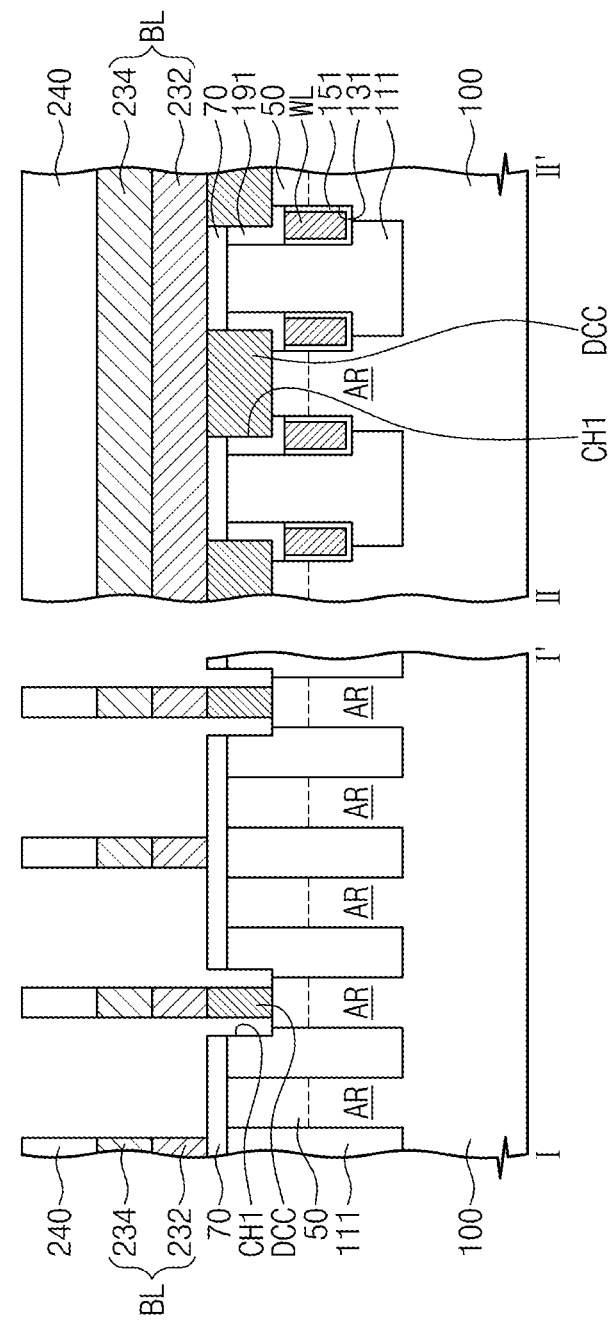

Referring to FIGS. 9A and 9B, a bit line BL may be formed by patterning the electrode layer 230 using the insulative pattern 240 as an etch mask. Thereafter, the contact pattern 215 may be etched to form a bit line node contact DCC within the first contact hole CH1. The bit line BL may run across the active region AR in the second direction Y so as to pass on the bit line node contact DCC. The formation of the bit line BL and the bit line node contact DCC may at least partially expose the top surface of the buffer layer 70 and further expose the active region AR and the device isolation layer 111 in the first contact hole CH1.

The bit line BL may include a first conductive pattern 232 and a second conductive pattern 234 stacked, for example sequentially stacked on the substrate 100.

Figure 10A:
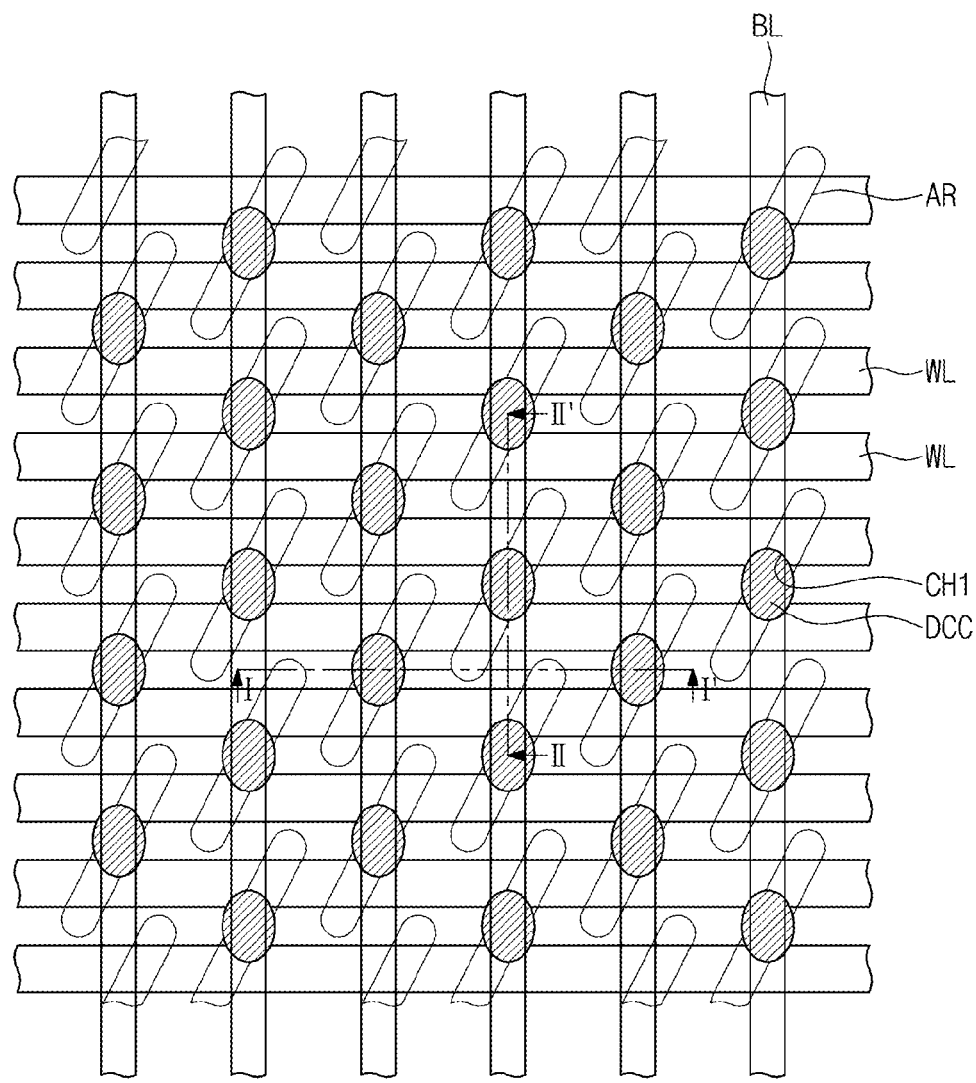
Figure 10B:
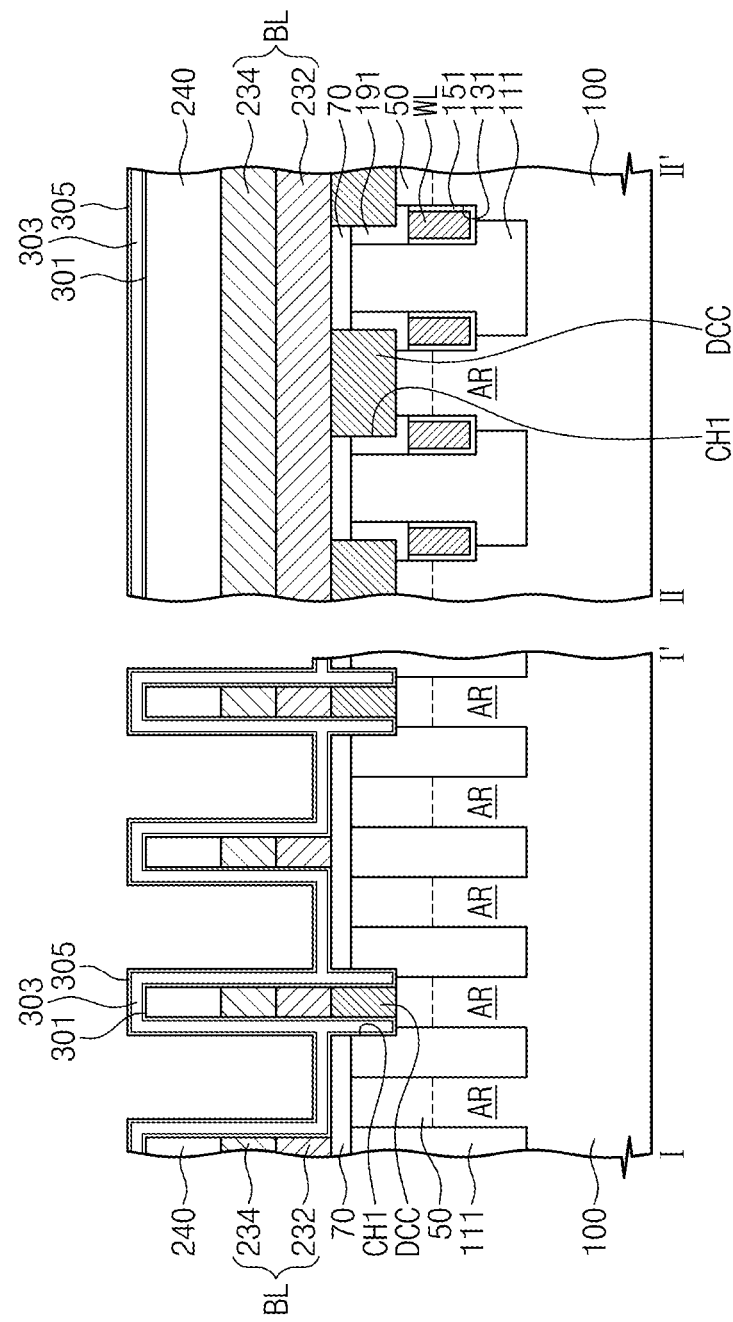

Referring to FIGS. 10A and 10B, a first spacer layer 301 may be formed to conform to a profile including the bit line BL formed on the substrate 100. For example, the first spacer layer 301 may conformally cover sidewalls of the first conductive pattern 232, sidewalls of the second conductive pattern 234, sidewalls and a top surface of the insulative pattern 240, the top surface of the buffer layer 70, sidewalls of the bit line node contact DCC, and an inner surface of the first contact hole CH1. The first spacer layer 301 may include, for example, a silicon nitride layer.

A sacrificial spacer layer 303 may be formed on the first spacer layer 301. The sacrificial spacer layer 303 may conformally cover the first spacer layer 301. For example, the sacrificial spacer layer 303 may fill the rest space of the first contact hole CH1 that is not completely filled with the bit line node contact DCC. The sacrificial spacer layer 303 may include a material having an etch selectivity with respect to the first spacer layer 301. For example, the sacrificial spacer layer 303 may include a silicon oxide layer.

A second spacer layer 305 may be formed on the sacrificial spacer layer 303. The second spacer layer 305 may conformally cover the sacrificial spacer layer 303. The second spacer layer 305 may include a material having an etch selectivity with respect to the sacrificial spacer layer 303. For example, the second spacer layer 305 may include a silicon nitride layer.

Figure 11A:
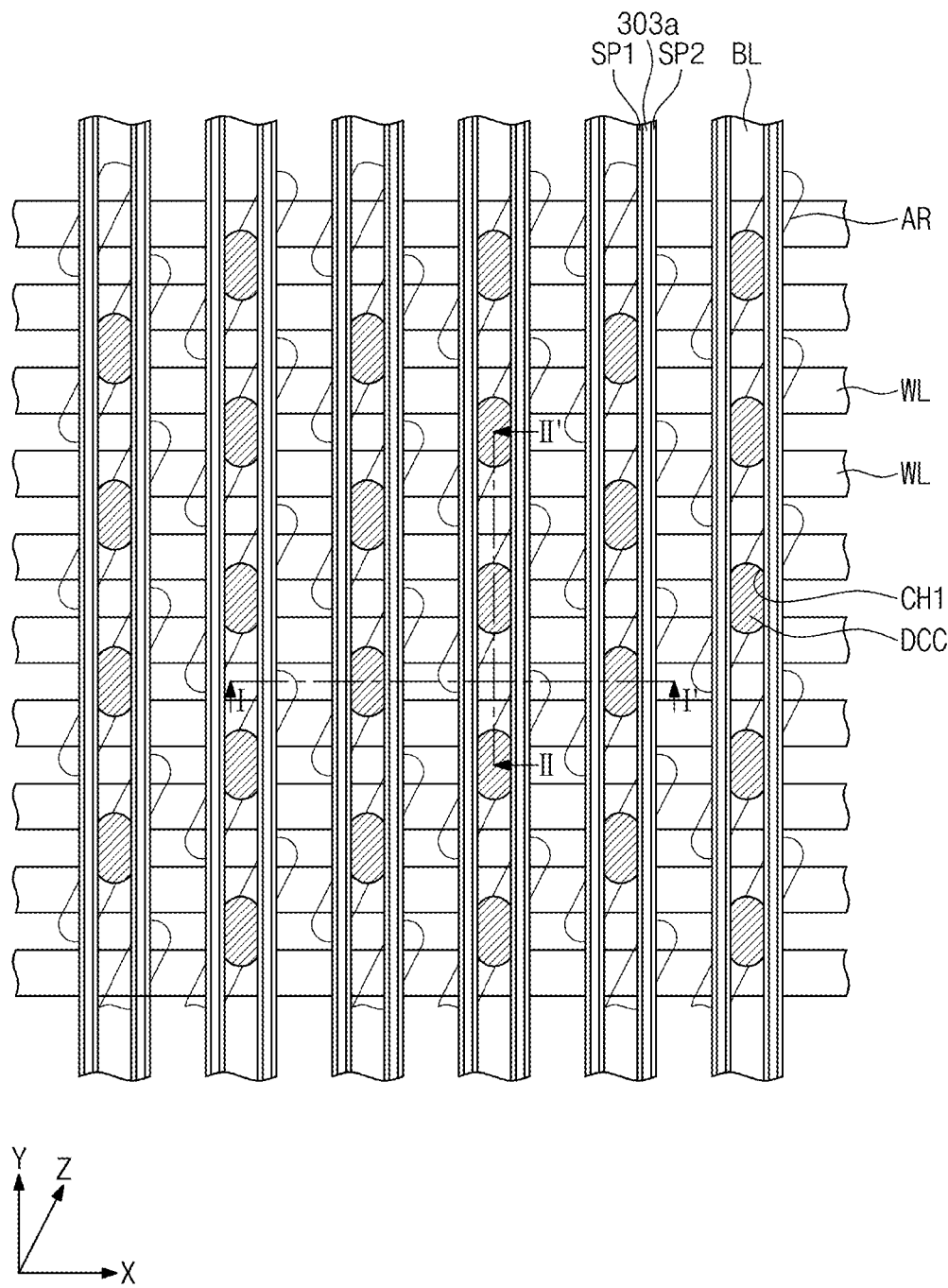
Figure 11B:
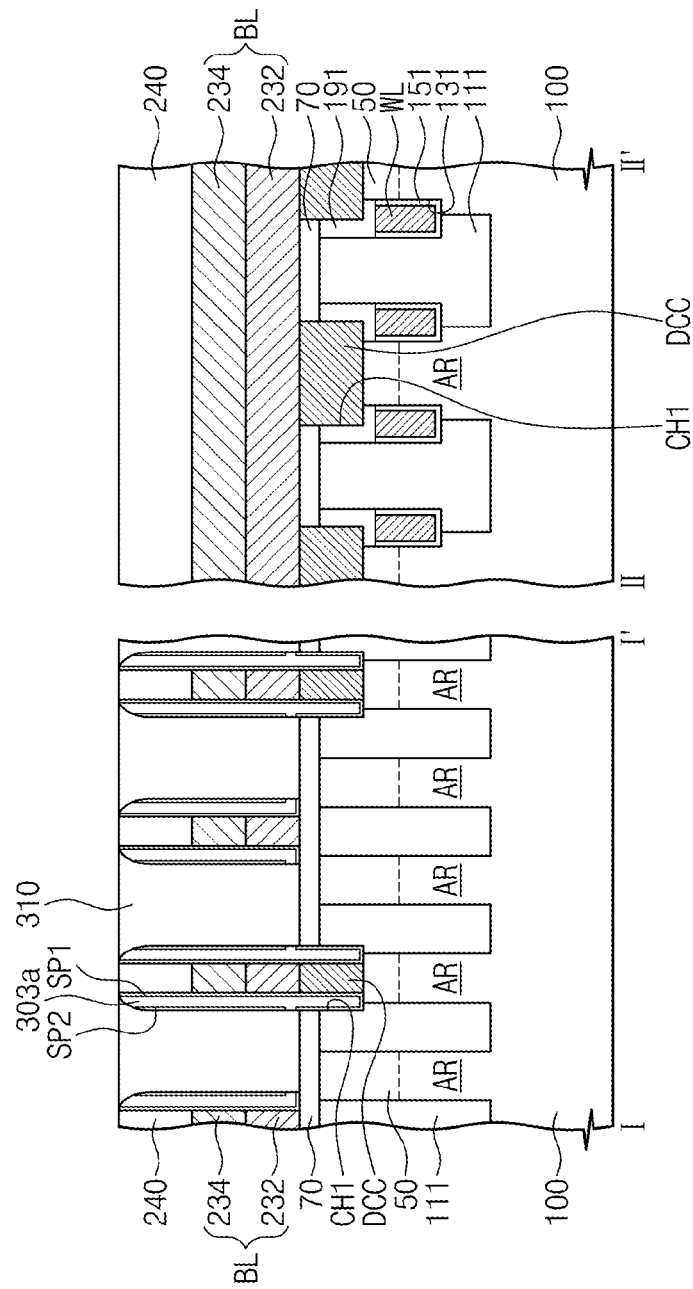

Referring to FIGS. 11A and 11B, an etch-back process may be performed to etch, for example sequentially etch the second spacer layer 305, the sacrificial spacer layer 303, and the first spacer layer 301 so as to expose the top surface of the insulative pattern 240 and the top surface of the buffer layer 70. Accordingly, a first sub-spacer SP1, a sacrificial spacer 303a, and a second sub-spacer SP2 may be formed stacked, for example sequentially stacked on the sidewalls of the first conductive pattern 232, the second conductive pattern 234, the insulative pattern 240, and the bit line node contact DCC.

An insulation layer 310 may be formed to fill between the bit lines BL on the buffer layer 70. The insulation layer 310 may have a top surface coplanar with the top surface of the insulative pattern 240. The insulation layer 310 may include, for example, a silicon oxide layer, a silicon nitride layer, a silicon oxynitride layer, or a combination thereof.

Figure 12A:
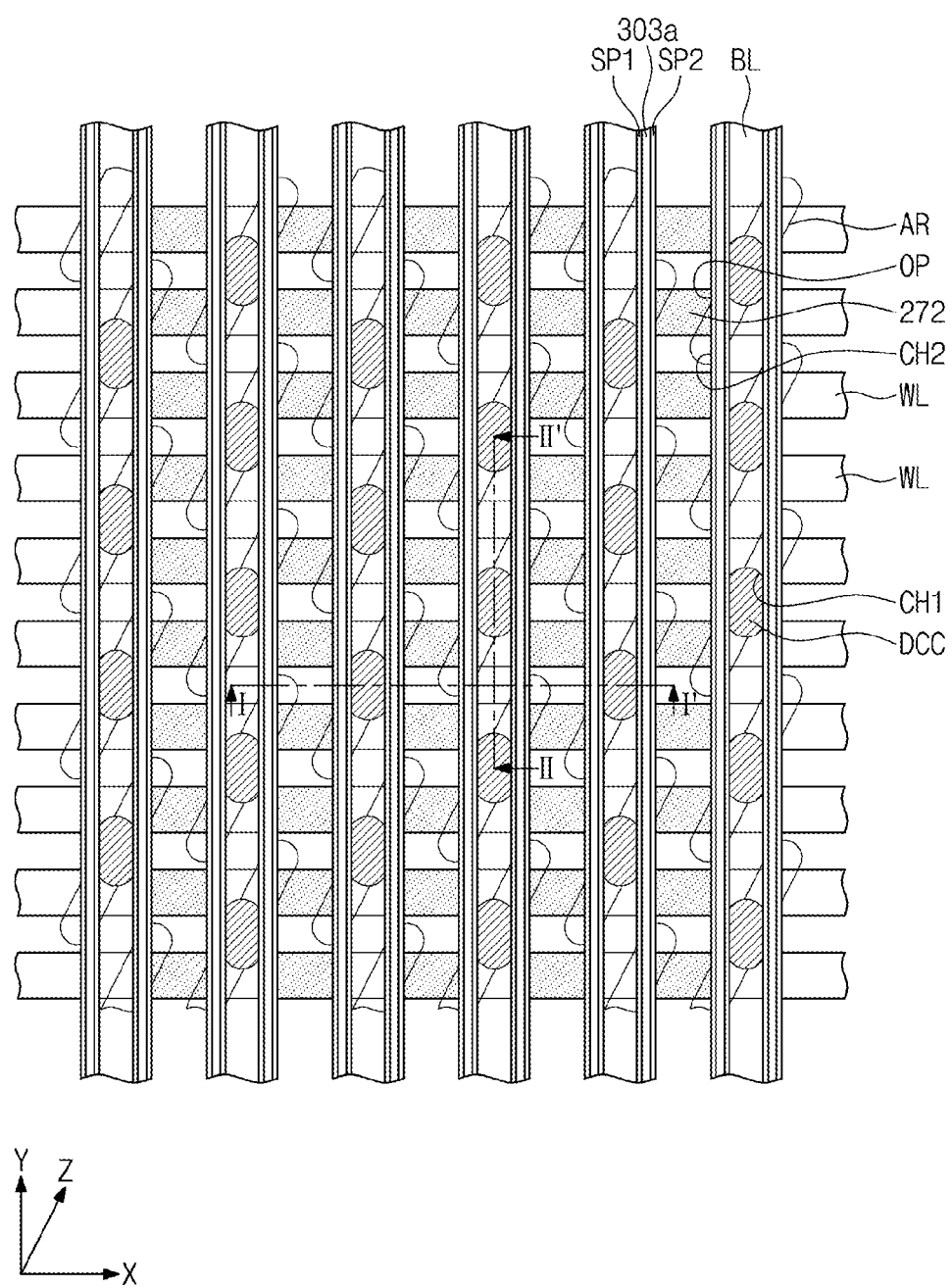
Figure 12B:
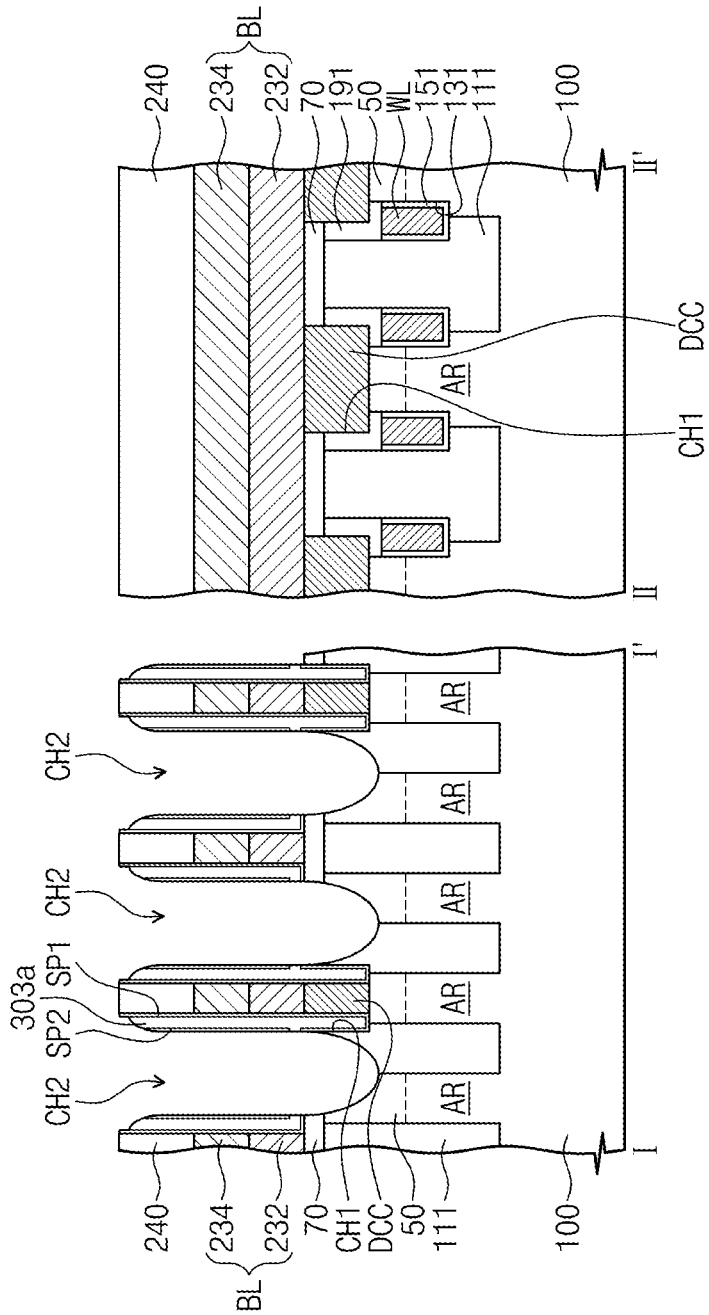

Referring to FIGS. 12A and 12B, the insulation layer 310 may be at least partially etched to form openings OP. As viewed in plan, each, or at least one, of the openings OP may be formed on an intersection where the word line WL crosses an area between adjacent bit lines BL. The openings OP may be filled with an insulative material to form separation patterns 272. Although not shown in figures, the separation patterns 272 may have top surfaces coplanar with the top surface of the insulative pattern 240. The separation patterns 272 may have a material having an etch selectivity with respect to the insulation layer 310. The separation pattern 272 may include at least one of, for example, a SiBCN layer, a SiCN layer, a SiOCN layer, and a SiN layer.

A second contact hole CH2 may be formed by removing the insulation layer 310, the buffer layer 70 exposed when the insulation layer 310 is removed, and a portion of the substrate 100. The second contact hole CH2 may be defined by the bit lines BL adjacent to each other and the separation patterns 272 facing to each other in the second direction Y. The second contact hole CH2 may expose the source/drain region 50 formed in the active region AR.

Upper portions of the sacrificial spacer 303a and the second sub-spacer SP2 may be at least partially etched when the etch process is performed to form the second contact hole CH2.

Figure 13A:
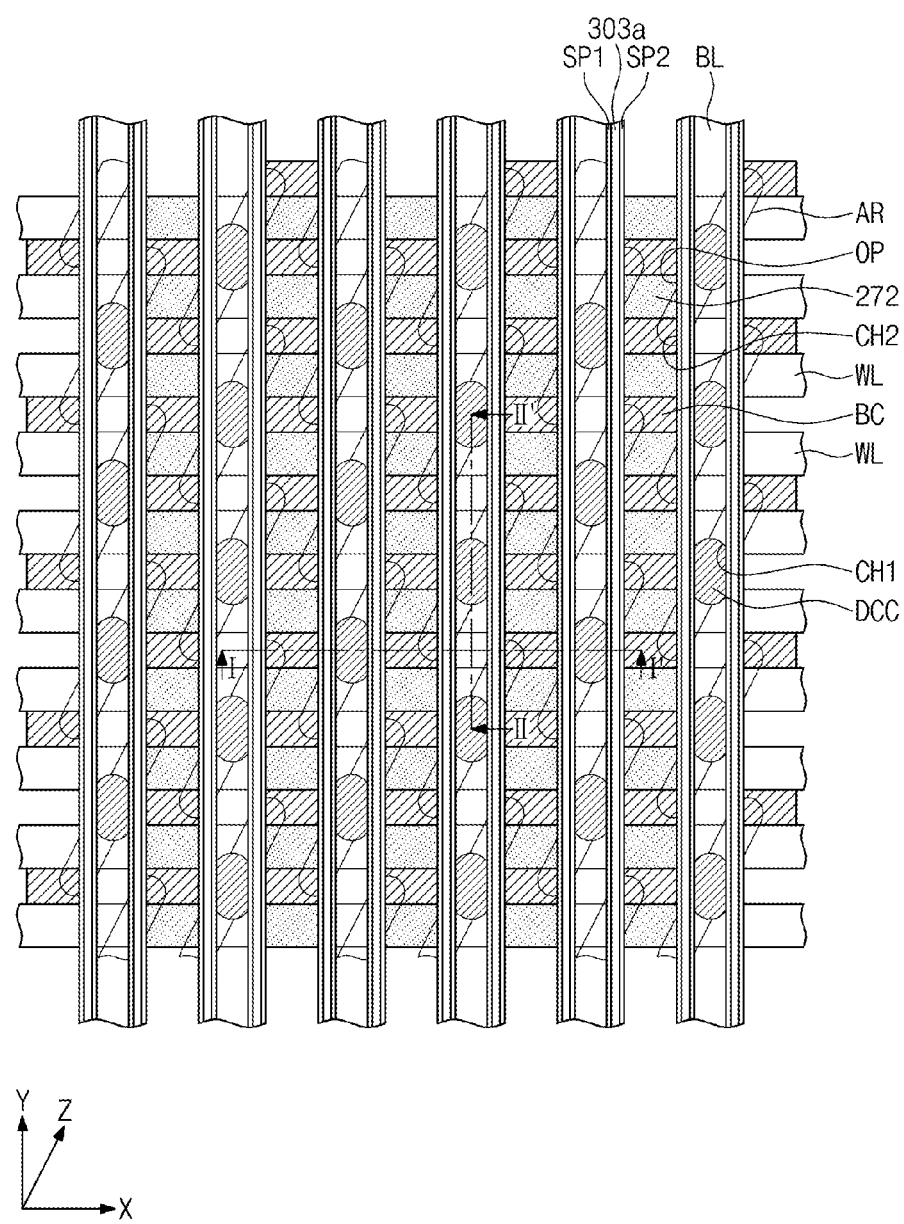
Figure 13B:
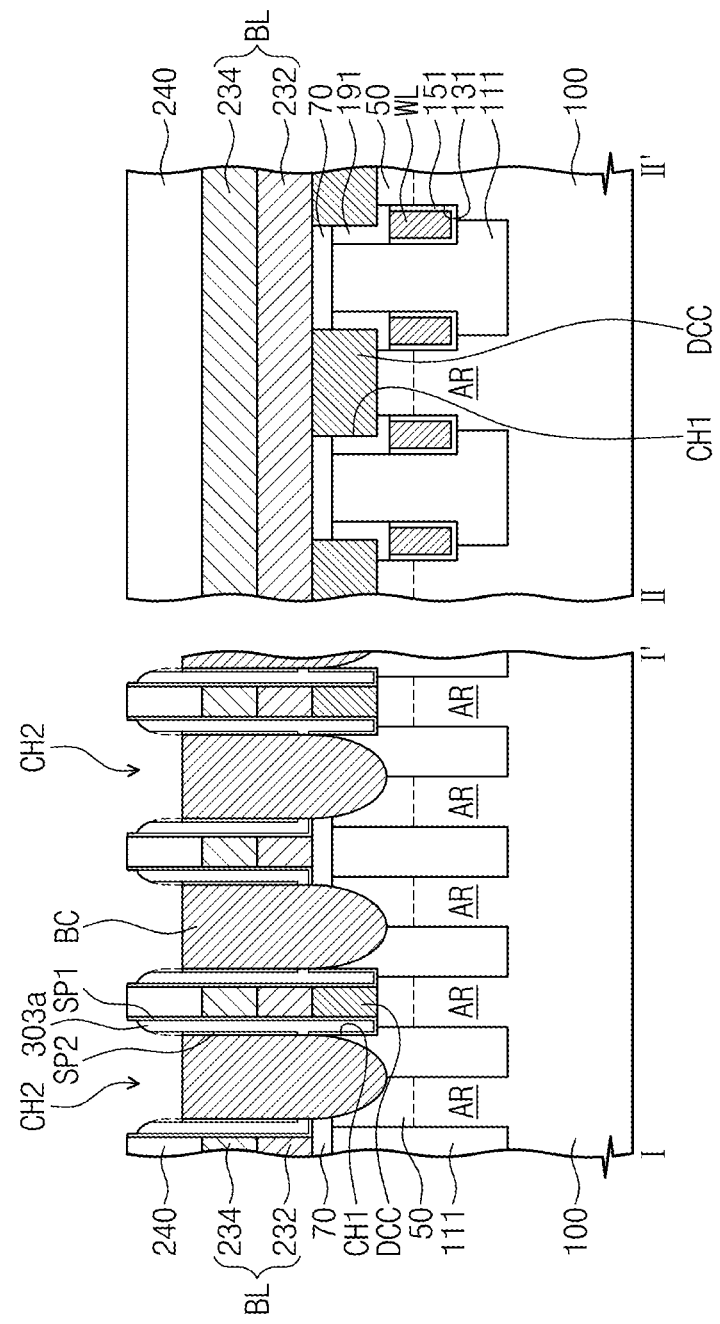

Referring to FIGS. 13A and 13B, a storage node contact BC may be formed within the second contact hole CH2. The storage node contact BC may be disposed on the active region AR and electrically connected to the source/drain region 50. The storage node contact BC may at least partially fill the second contact hole CH2. In detail, a conductive layer (not shown) may be formed to fill the second contact hole CH2 and then an etch process (e.g., an etch-back process) may be performed on the conductive layer, such that the storage node contact BC may be formed in a lower portion of the second contact hole CH2. The storage node contact BC may have a top surface positioned between top and bottom surfaces of the insulative pattern 240. Upper portions of the first sub-spacer SP1, the sacrificial spacer 303a, and the second sub-spacer SP2 may be at least partially exposed from the storage node contact BC. The storage node contact BC may include at least one of, for example, a metal silicide layer, a polysilicon layer, a metal nitride layer, and a metal layer.

The exposed upper portion of the second sub-spacer SP2 may be removed from on the storage node contact BC. Accordingly, the sacrificial spacer 303a may have an exposed sidewall which has been covered by the second sub-spacer SP2. The at least partial removal of the second sub-spacer SP2 may use an etch recipe having an etch selectivity with respect to the sacrificial spacer 303a. The at least partial removal may be performed by a wet or dry etch process.

Figure 14A:
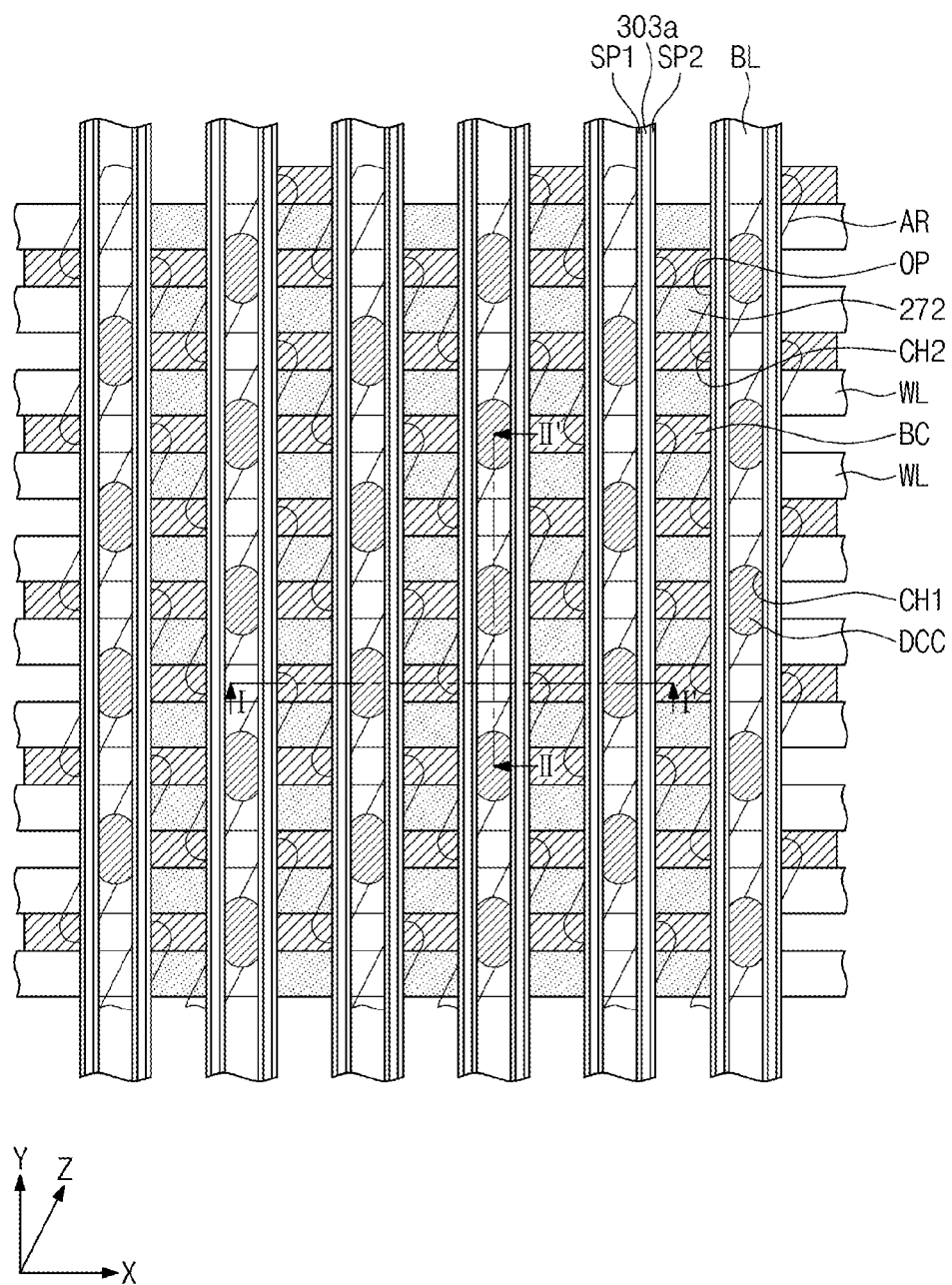
Figure 14B:
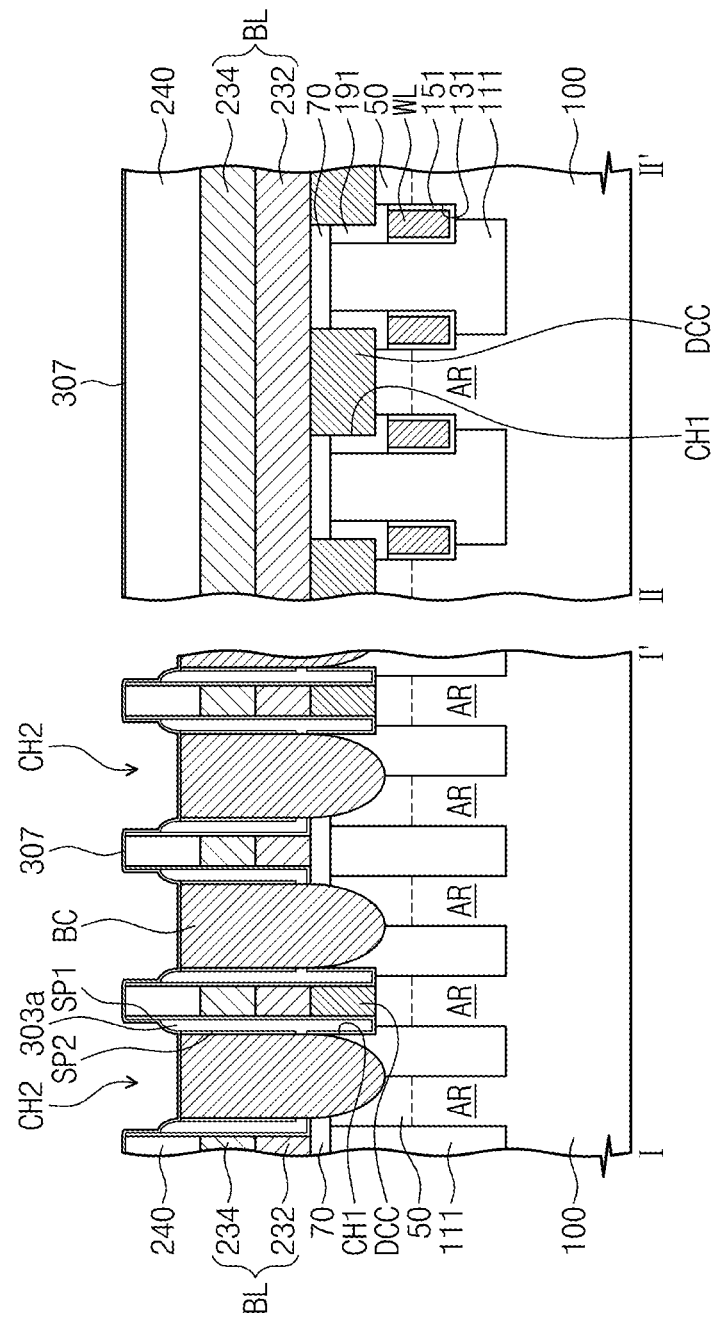

Referring to FIGS. 14A and 14B, the sacrificial spacer 303a may be etched to at least partially lose its upper portion which is exposed from the second sub-spacer SP2 and the storage node contact BC. Accordingly, the upper portion of the sacrificial spacer 303a may have a reduced height level. In this case, the height-reduced upper portion of the sacrificial spacer 303a may be exposed to the second contact hole CH2. After the etch process at this step, the height-reduced upper portion of the sacrificial spacer 303a may be exposed from the second sub-spacer SP2 and the storage node contact BC. The sacrificial spacer 303a may have an upper sidewall that convexly extends toward the second contact hole CH2. For example, the sacrificial spacer 303a may have a rounded sidewall that extends toward the second contact hole CH2. The etch process may be, for example, a dry etch process (e.g., an etch-back process).

A third spacer layer 307 may be formed to conform to a profile including the storage node contact BC formed on the substrate 100. For example, the third spacer layer 307 may conformally cover the top surface of the storage node contact BC, the upper sidewall of the sacrificial spacer 303a, a portion of a sidewall of the first sub-spacer SP1 exposed from the sacrificial spacer 303a, and the top surface of the insulative pattern 240. The third spacer layer 307 may include a material identical to that of the second sub-spacer SP2. For example, the third spacer layer 307 may include a silicon nitride layer.

Figure 15A:
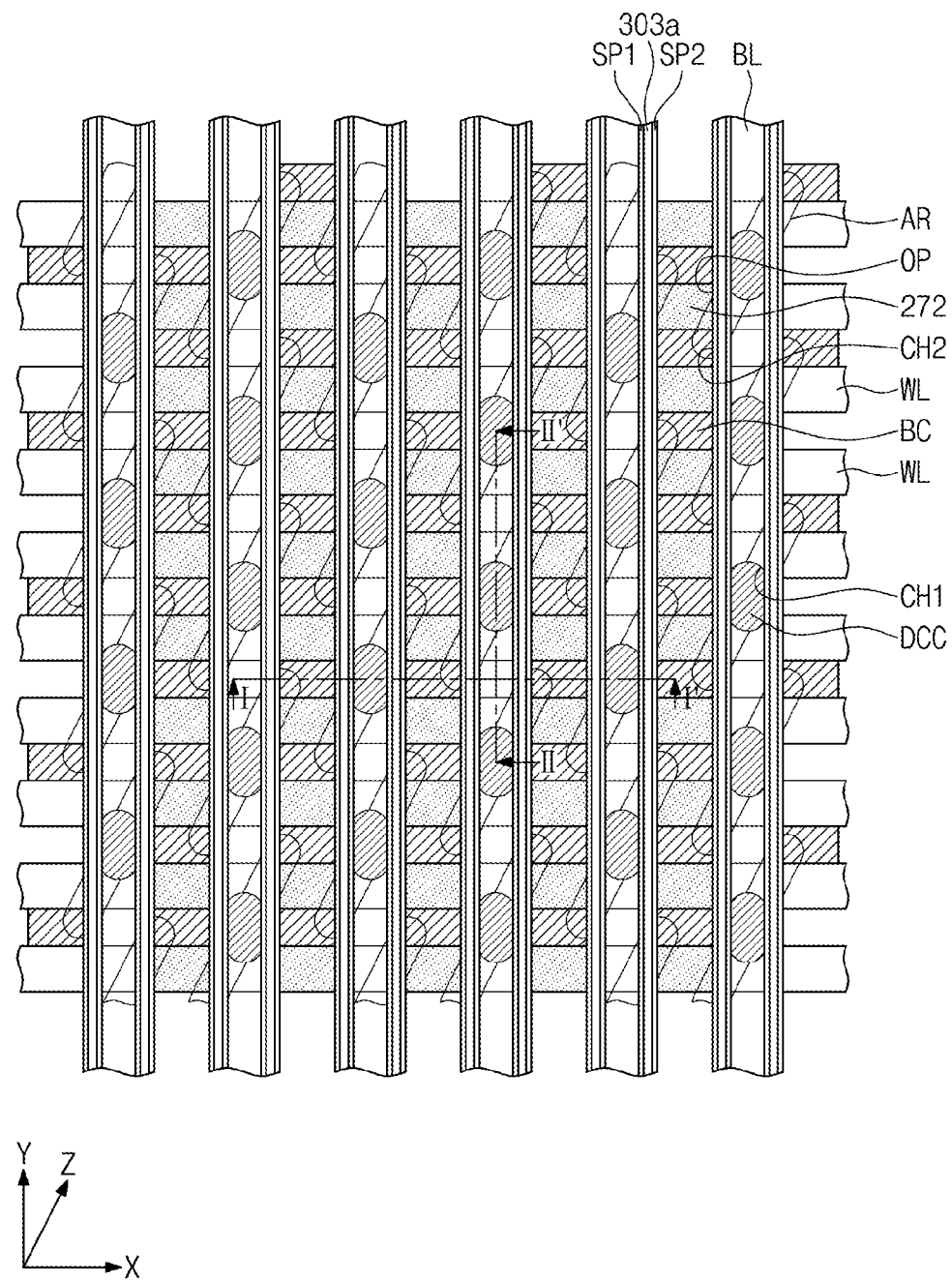
Figure 15B:
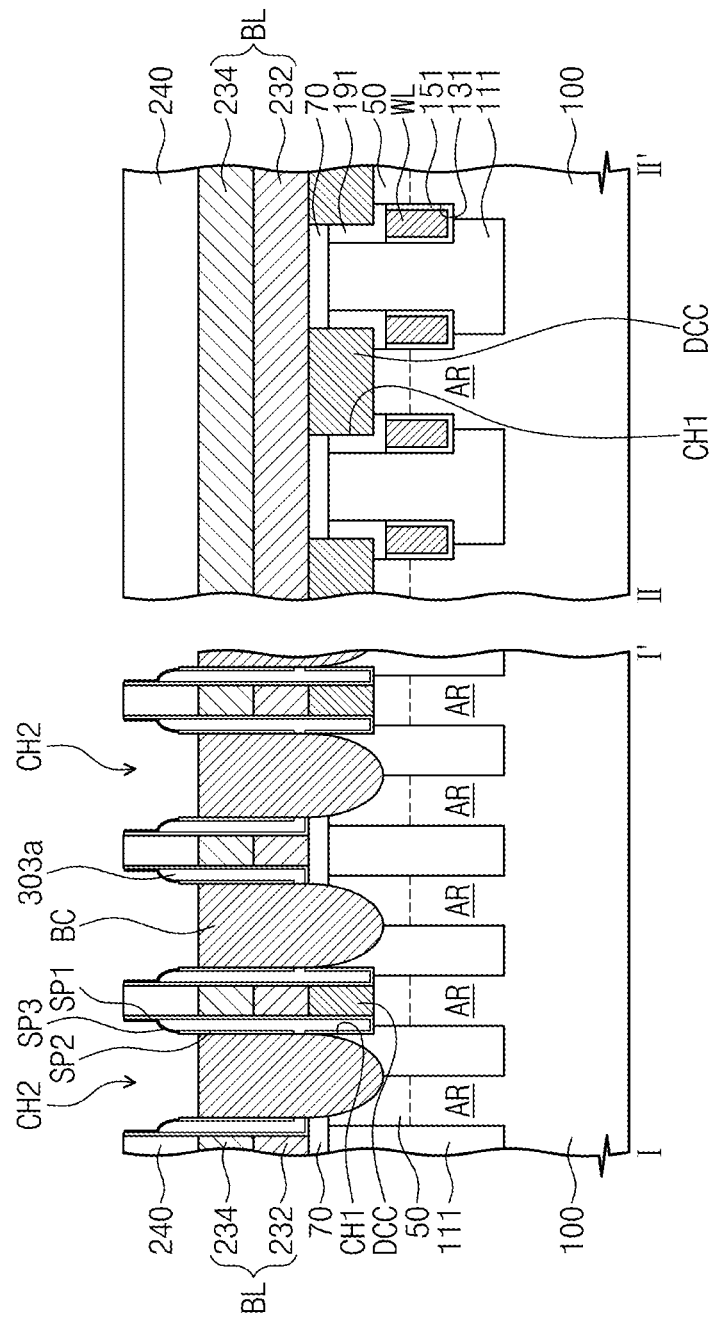

Referring to FIGS. 15A and 15B, a third-sub spacer SP3 may be formed by at least partially removing the third spacer layer 307 from on the top surfaces of the storage node contact BC and the insulative pattern 240. The formation of the third sub-spacer SP3 may expose the top surfaces of the storage node contact BC and the insulative pattern 240. The third sub-spacer SP3 may at least partially cover the sacrificial spacer 303a, the first sub-spacer SP1, and the second sub-spacer SP2. For example, the third sub-spacer SP3 may cover a portion of the sidewall of the sacrificial spacer 303a exposed from the first and second sub-spacers SP1 and SP2, the sidewall of the first sub-spacer SP1 exposed from the sacrificial spacer 303a, and a portion of a top surface of the second sub-spacer SP2. As the third spacer layer 307 is at least partially removed, the third spacer SP3 may have a thickness that is less than a thickness of the third spacer layer 307. A dry etch process may be employed to at least partially remove the third spacer layer 307.

An etch process may be perform to at least partially etch an upper portion of the storage node contact BC. The etch process may expose the top surface of the second sub-spacer SP2 and further expose a portion of a sidewall of the second sub-spacer SP2. For example, the etch process may cause the storage node contact BC to have a reduced top surface flush with a top surface of the bit line BL. The top surface of the storage node contact BC may be positioned lower than the top surface of the second sub-spacer SP2. The etch process may be an etch-back process.

Figure 16A:
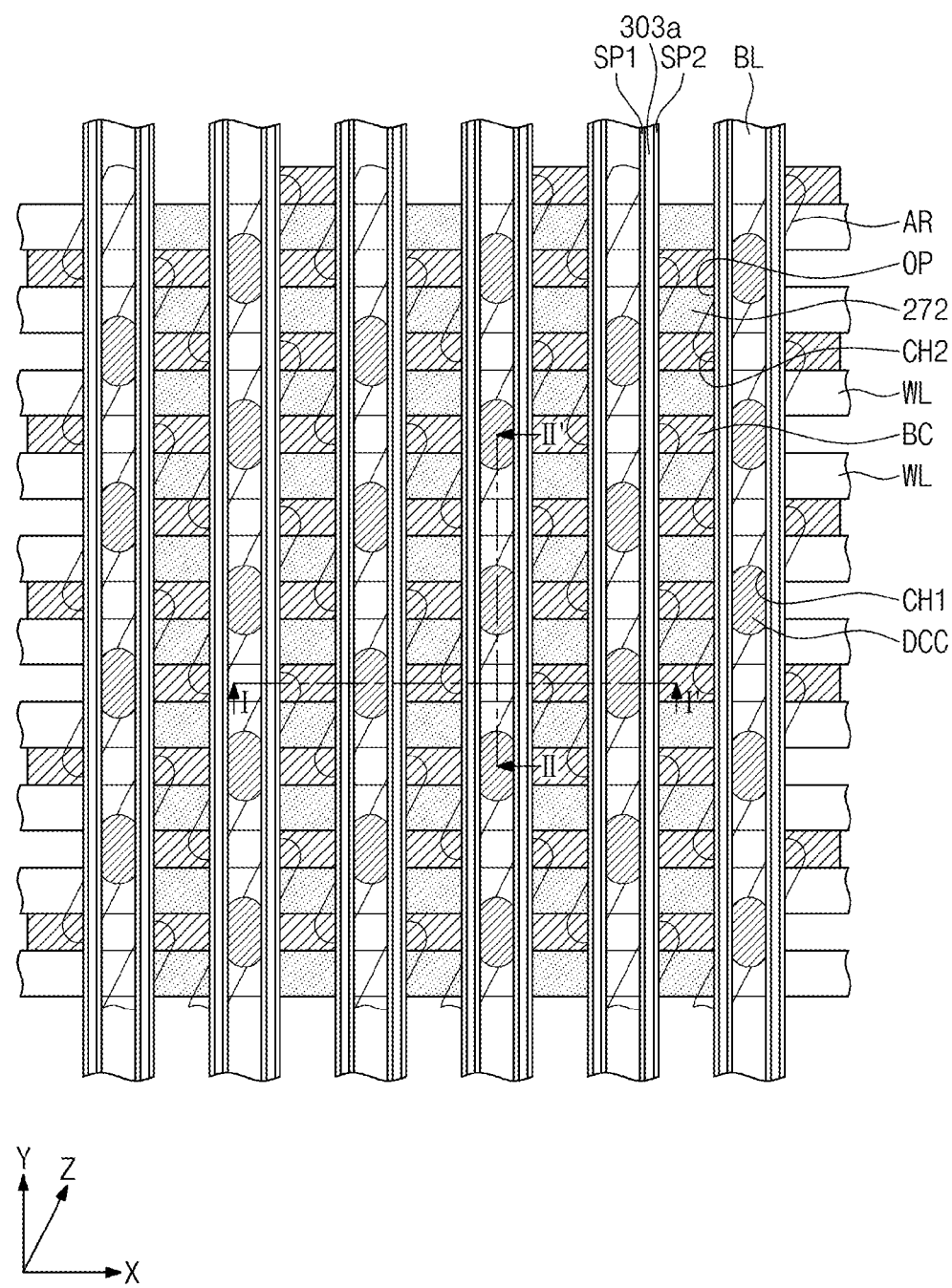
Figure 16B:
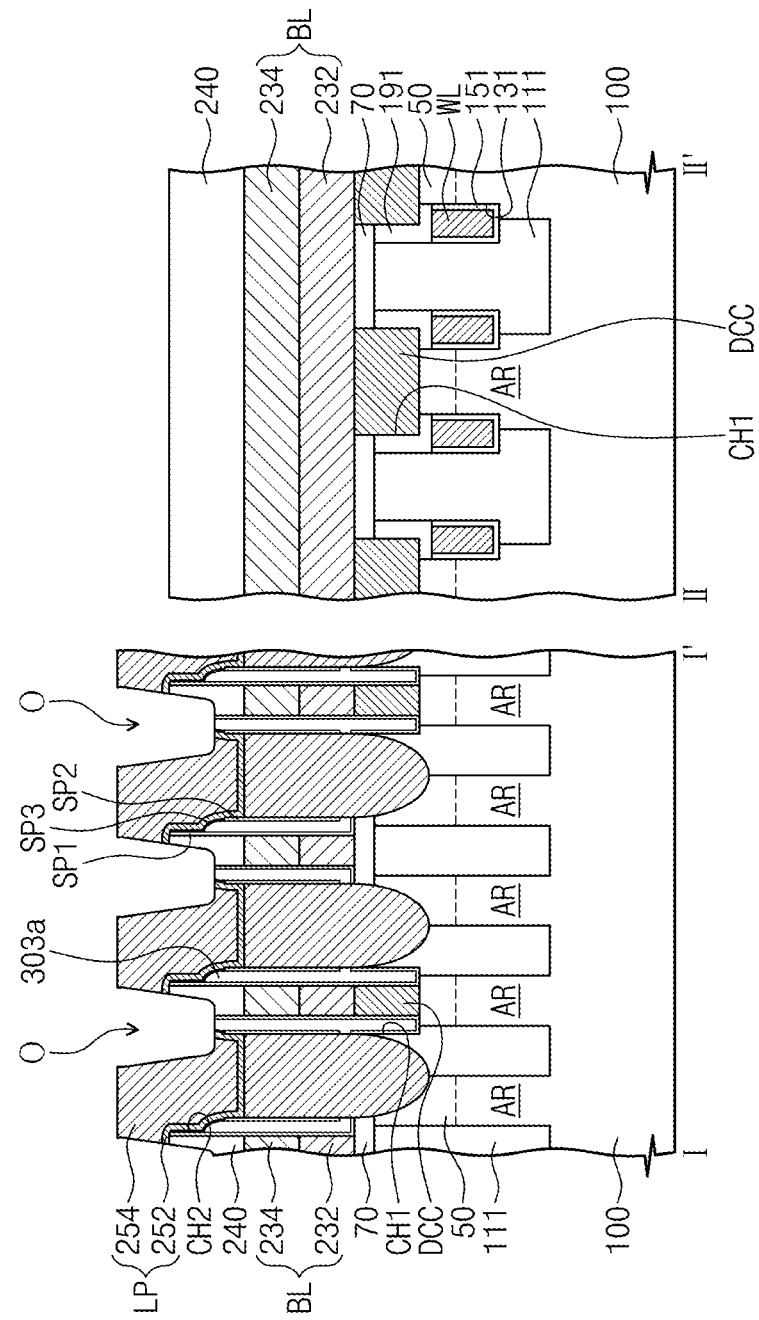

Referring to FIGS. 16A and 16B, a landing pad LP may be formed on the storage node contact BC. In detail, the landing pad LP may be formed by forming a barrier layer (not shown) in the second contact hole CH2 having the storage node contact BC formed therein, forming a metal layer (not shown) to fill the second contact hole CH2, and patterning, for example sequentially patterning the metal layer and the barrier layer. The barrier layer may conformally cover the top surface of the storage node contact BC, the top surface and a portion of the sidewall of the second sub-spacer SP2, a sidewall of the third sub-spacer SP3, a top surface of the first sub-spacer SP1, and the top surface of the insulative pattern 240. A space O may be provided between a plurality of the landing pads LP. The landing pads LP may be spaced apart from each other with the space O therebetween. Each, or at least one, of the landing pads LP may include a barrier pattern 252 and a metal pattern 254, stacked, for example sequentially stacked on the storage node contact BC, that are formed by patterning the barrier layer and the metal layer.

An etch process may be performed to at least partially remove the insulative pattern 240, the first sub-spacer SP1 formed on the insulative pattern 240, the sacrificial spacer 303a formed on the first sub-spacer SP1, and the third sub-spacer SP3 formed on the sacrificial spacer 303a. Accordingly, upper portions of the first sub-spacer SP1, the sacrificial spacer 303a, and the third sub-spacer SP3 may be at least partially exposed to the space O.

Figure 17A:
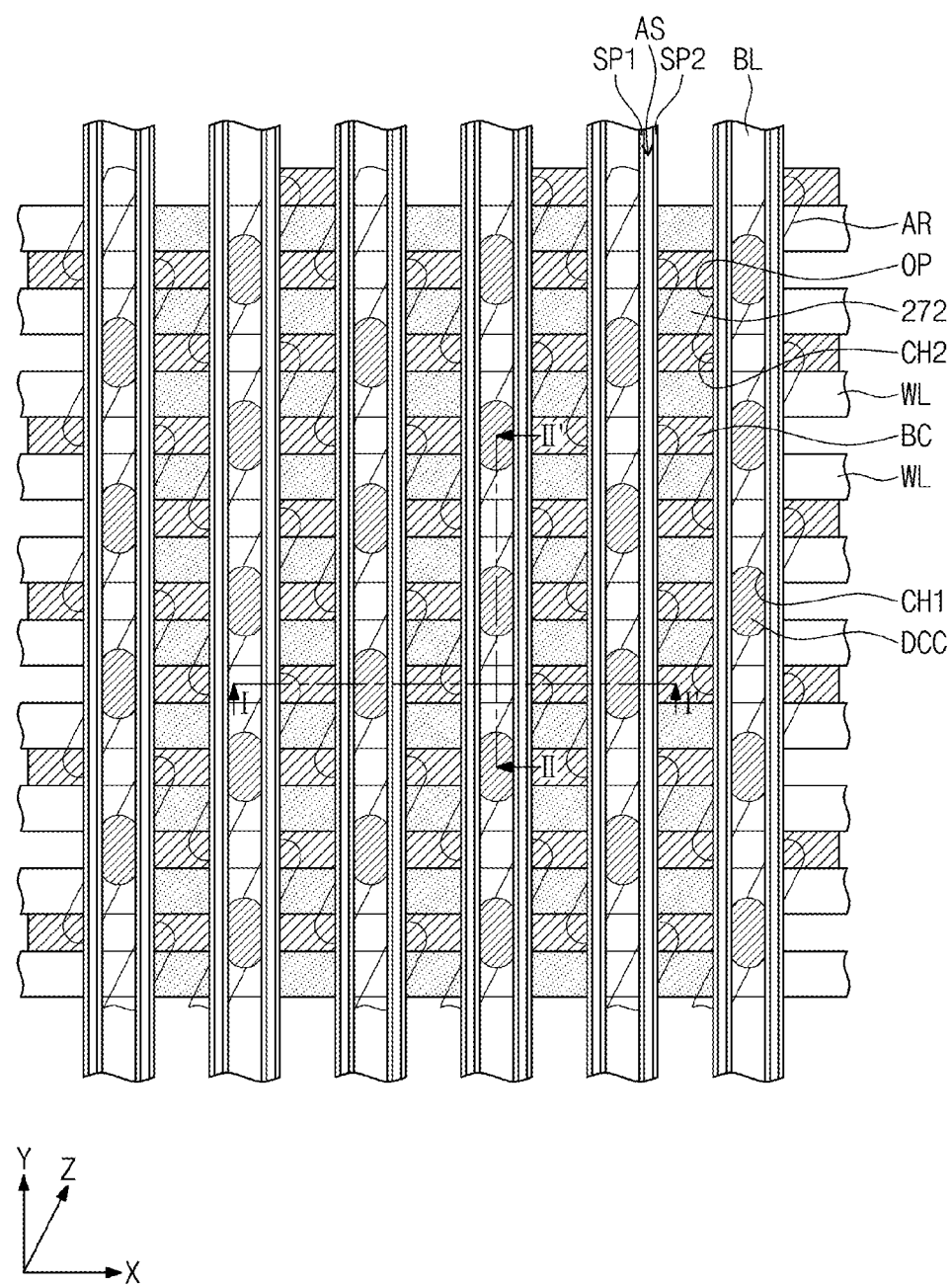
Figure 17B:
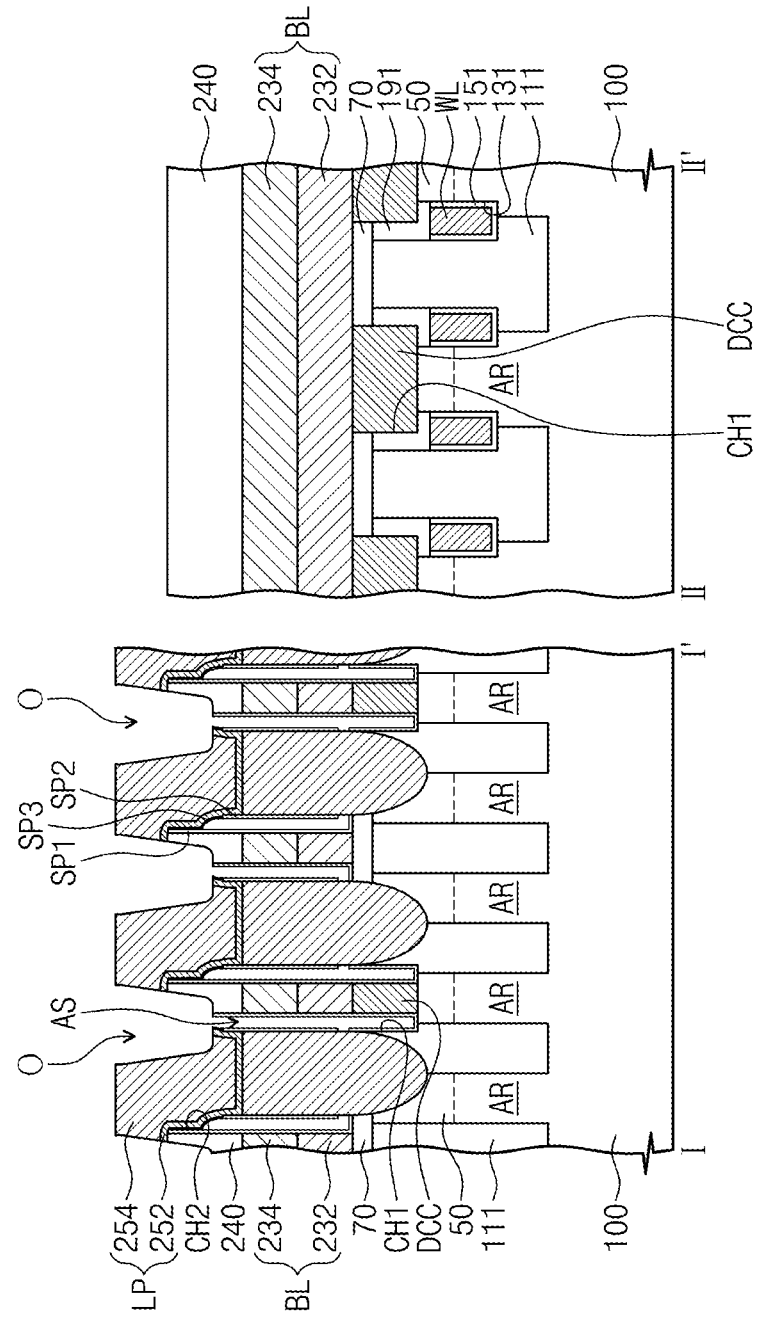

Referring to FIGS. 17A and 17B, the third sub-spacer SP3 exposed to the space O may be selectively removed. Accordingly, a hollow space AS may be formed between the first and second sub-spacers SP1 and SP2 and between the first and third sub-spacers SP1 and SP3. The hollow space AS may expose an inner surface of the first sub-spacer SP1, the sidewall of the second sub-spacer SP2, a portion of the sidewall of the third sub-spacer SP3, a portion of the storage node contact BC exposed between the first and second sub-spacers SP1 and SP2. The sacrificial spacer 303a may be removed using an etch recipe having an etch selectivity with respect to the first sub-spacer SP1, the second sub-spacer SP2, the third sub-spacer SP3, and the insulative pattern 240. The removal of the sacrificial spacer 303a may be performed by a wet etch process using an etchant such as hydrofluoric acid (HF) or LAL (Limulus amoebocyte lysate) solution.

Figure 18A:
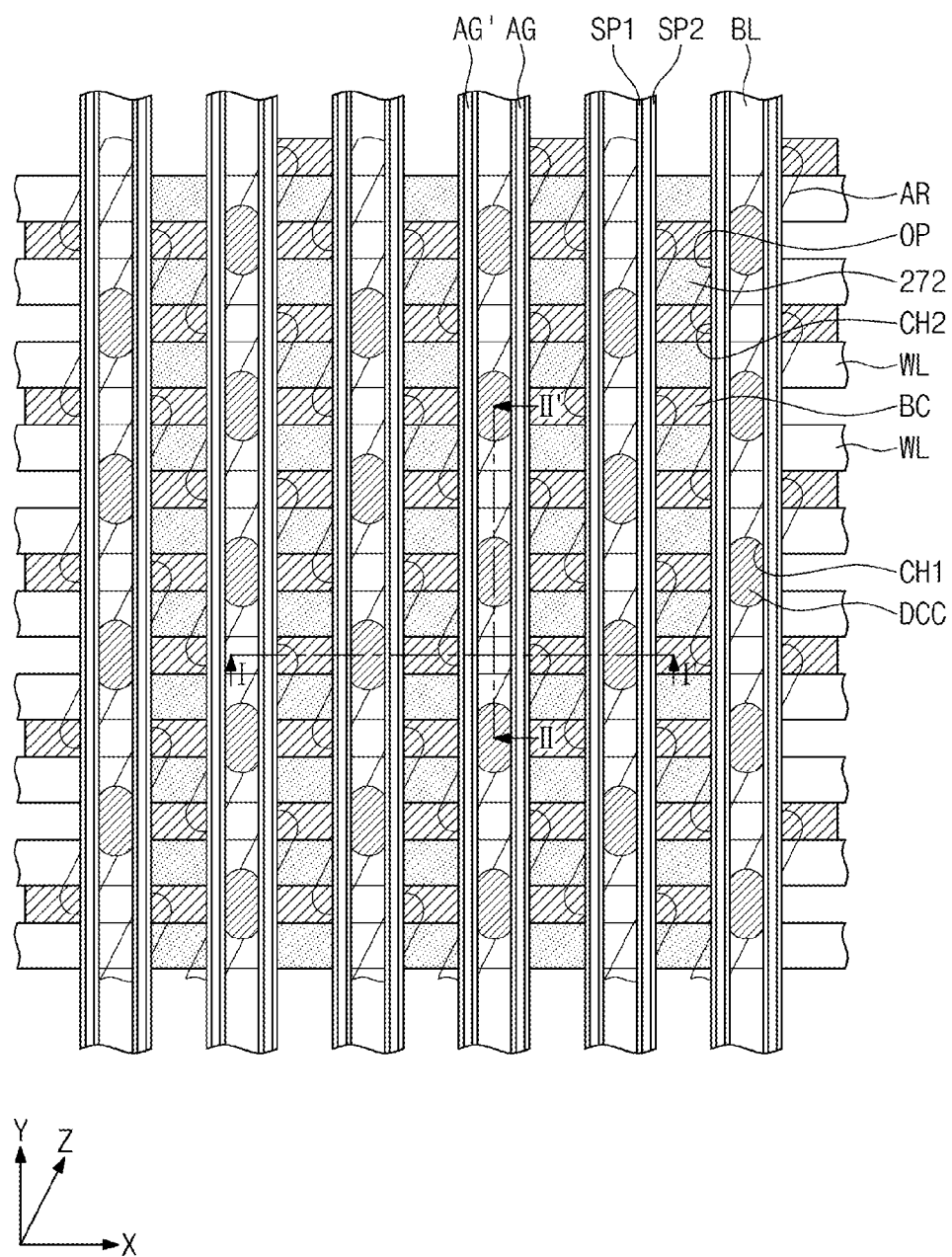
Figure 18B:
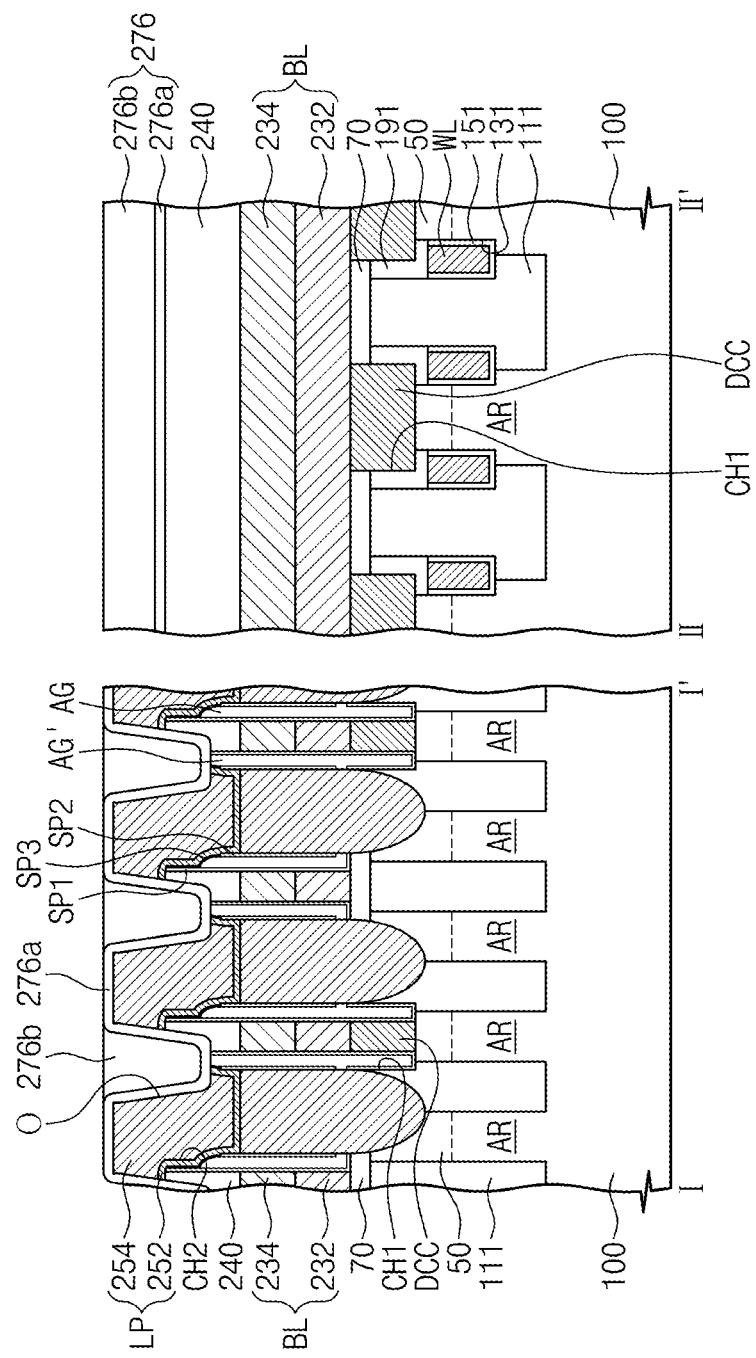

Referring to FIGS. 18A and 18B, a first insulation layer 276a may be formed on the landing pads LP. The first insulation layer 276a may conform to a profile including the landing pad LP formed on the substrate 100. In detail, the first insulation layer 276a may cover top surfaces of the landing pads LP, sidewalls of the landing pads LP exposed to the space O, a portion of the sidewall of the insulative pattern 240 exposed to the space O, the top surface of the first sub-spacer SP1 exposed to the space O, the top surface of the second sub-spacer SP2, and an entrance of the hollow space AS. Accordingly, an air gap AG' and an air gap AG may be formed to extend along the bit line BL in the second direction Y and spaced apart from each other in the first direction X. For example, the air gap AG' may be defined surrounded by the first sub-spacer SP1, the second sub-spacer SP2, the third sub-spacer SP3, a portion of the storage node contact BC exposed between the second and first sub-spacers SP2 and SP1, and a portion of the first insulation layer 276a. The air gap AG may be defined surrounded by the first sub-spacer SP1, the second sub-spacer SP2, the third sub-spacer SP3, and a portion of the storage node contact BC exposed between the second and first sub-spacers SP2 and SP1. The first insulation layer 276a may be formed of or include an insulative material whose step coverage is poor. The first insulation layer 276a may include, for example, a tetraethylorthosilicate (TEOS) layer or a high plasma density (HDP) layer.

A second insulation layer 276b may be formed on the first insulation layer 276a. The second insulation layer 276b may cover the first insulation layer 276a and fill the space O. The second insulation layer 276b may include, for example, a silicon oxide layer or a silicon nitride layer.

Unlike the example embodiments, top surfaces of the sacrificial spacer and the second sub-spacer may be etched to decrease a thickness of the spacer, such that the landing pad may have an increased minimum critical width. To decrease a parasitic capacitance between the storage node contact and the bit line, the sacrificial spacer may be removed to form the spacer including the air gap therein. However, a top surface of the sacrificial spacer may be positioned below a bottom surface of an etching space formed between the landing pads, and thus it may be difficult to remove the sacrificial layer through the etching space. Accordingly, the minimum critical width of the landing pad may be secured, but it may be impossible to create the air gap in the spacer so that the parasitic capacitance may be hardly reduced.

In an example embodiment, the sacrificial spacer 303a may be formed to have a top surface positioned between the top surface of the first sub-spacer SP1 and the top surface of the second sub-spacer SP2 as shown in FIG. 15B such that the sacrificial spacer 303a may be exposed to the space O as shown in FIG. 16B. As a result, as shown in FIGS. 18A and 18B, the spacer may be formed to have the air gaps AG' and AG that can reduce a parasitic capacitance between the bit line BL and the storage node contact BC while securing a minimum critical width of the landing pad LP.

Referring back to FIGS. 1 and 2A, a planarization process may be performed on the first and second insulation layers 276a and 276b until the top surfaces of the landing pads LP are exposed. Therefore, a separation layer 276 may be formed to have the first and second insulation layers 276a and 276b that are locally disposed in the space O.

Information storage elements (e.g., capacitors) may be formed on the landing pads LP. Each, or at least one, of the information storage elements may include a bottom electrode BE, a dielectric layer (not shown), and a top electrode (not shown).

FIGS. 19 to 27 are cross-sectional views, taken along lines I-I' and II-IF of FIGS. 4A to 18A, illustrating a method for manufacturing a semiconductor device according to example embodiments of the inventive concepts. Those parts substantially the same as the parts formerly discussed are allocated the same reference numerals thereto, and detailed explanation thereof will be omitted for brevity.

Figure 19:
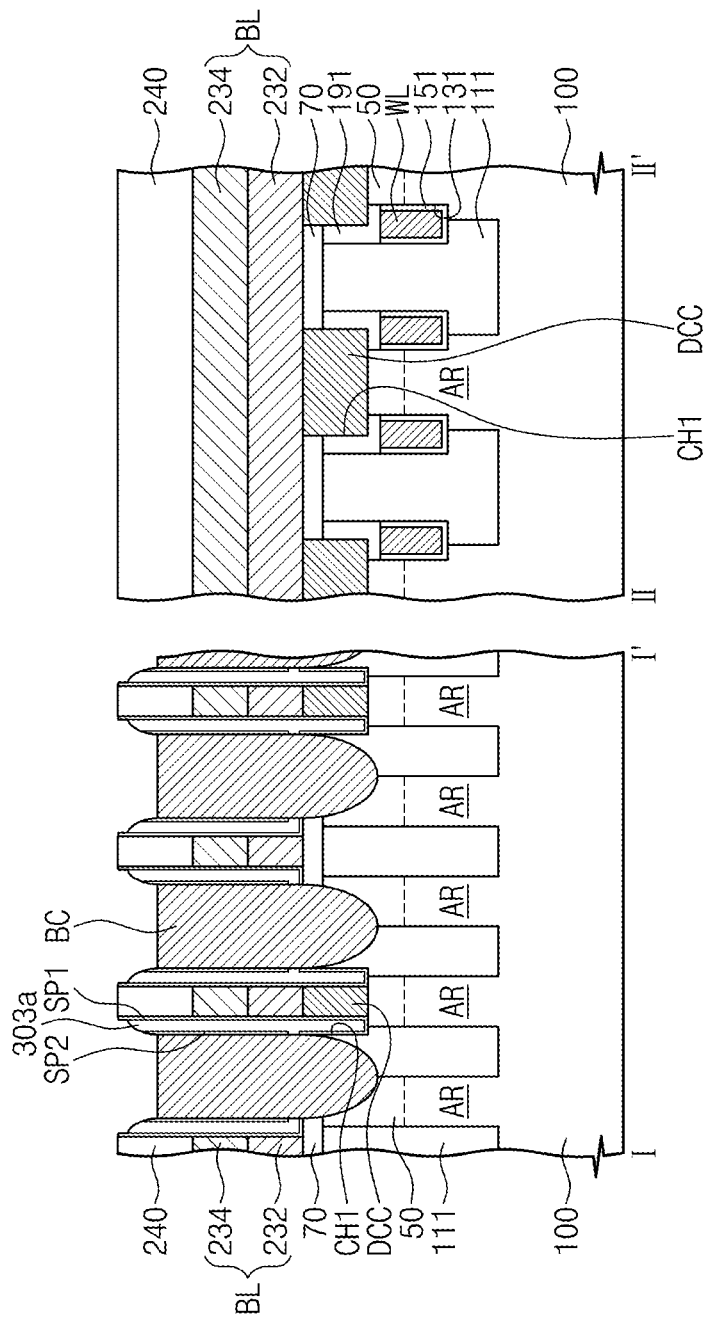
FIGS. 19 to 27 are cross-sectional views, taken along lines I-I' and II-II' of FIGS. 4A to 18A, illustrating a method for manufacturing a semiconductor device according to example embodiments of the inventive concepts.

Referring to FIG. 19, the storage node contact BC may be formed within the second contact hole CH2. The storage node contact BC may at least partially fill the second contact hole CH2. The upper portions of the first sub-spacer SP1, the second sub-spacer SP2, and the sacrificial spacer 303a may be at least partially exposed from the storage node contact BC.

Figure 20:
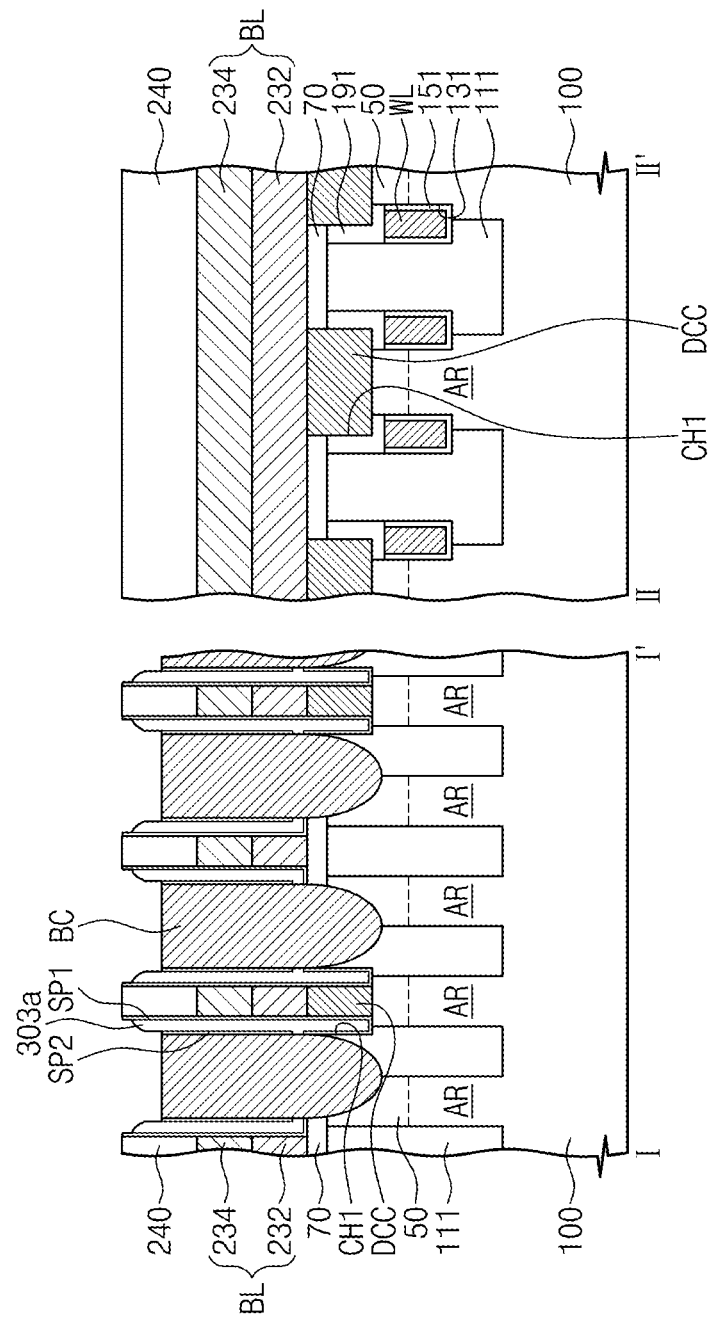

Referring to FIG. 20, a removal process may be performed to at least partially remove the upper portion of the second sub-spacer SP2 exposed from the storage node contact BC. The sidewall of the sacrificial spacer 303a may then be at least partially exposed from the second sub-spacer SP2. It thus may be possible to increase a surface area of the upper sidewall of the sacrificial spacer 303a exposed from the storage node contact BC. The second sub-spacer SP2 may have the top surface coplanar with the top surface of the storage node contact BC. The at least partial removal of the second sub-spacer SP2 may be performed by a wet etch process with an etch recipe (e.g., phosphoric acid) having an etch selectivity with respect to the sacrificial spacer 303a.

Figure 21:
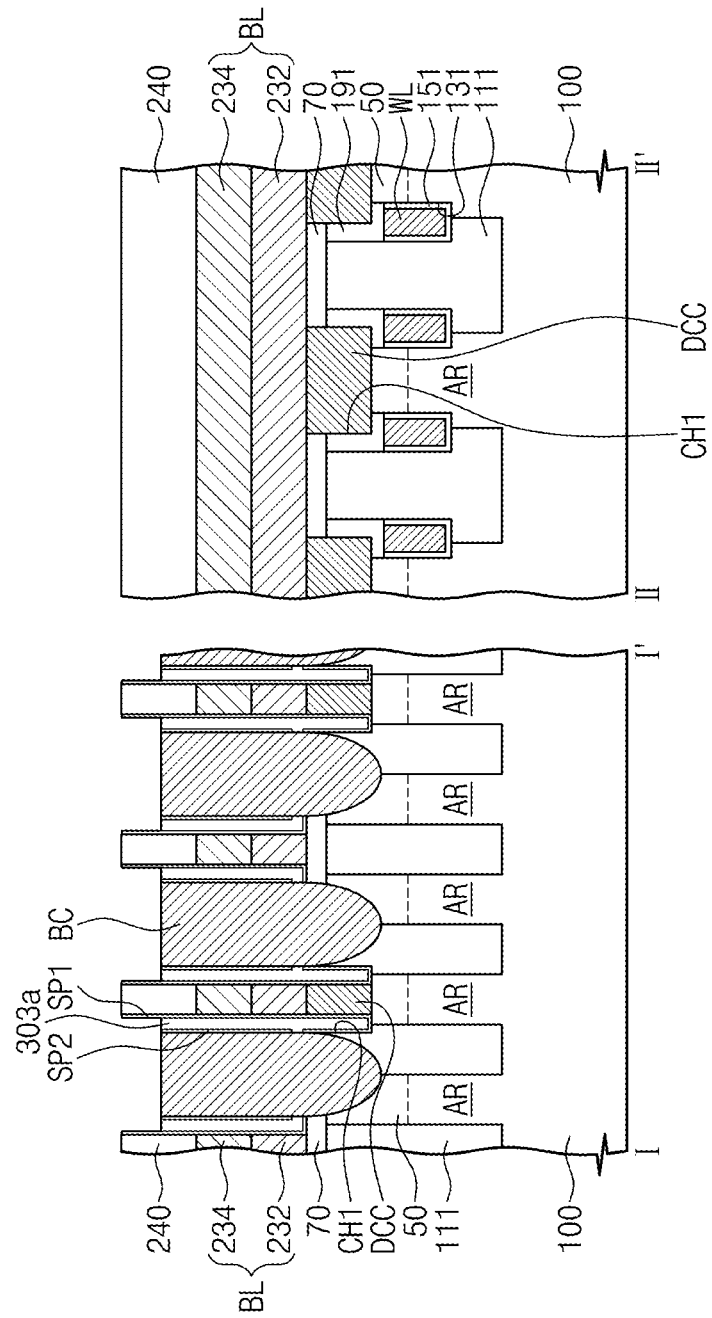

Referring to FIG. 21, a removal process may be performed to at least partially remove the upper portion of the sacrificial spacer 303a exposed from the storage node contact BC. The sidewall of the first spacer SP1 may then be at least partially exposed form the sacrificial spacer 303a. The sacrificial spacer 303a may have a top surface coplanar with the top surfaces of the storage node contact BC and the second sub-spacer SP2. The at least partial removal of the sacrificial spacer 303a may be performed by a wet etch process with an etch recipe (e.g., hydrofluoric acid or LAL (Limulus amoebocyte lysate) solution) having an etch selectivity with respect to the second sub-spacer SP2.

Figure 22:
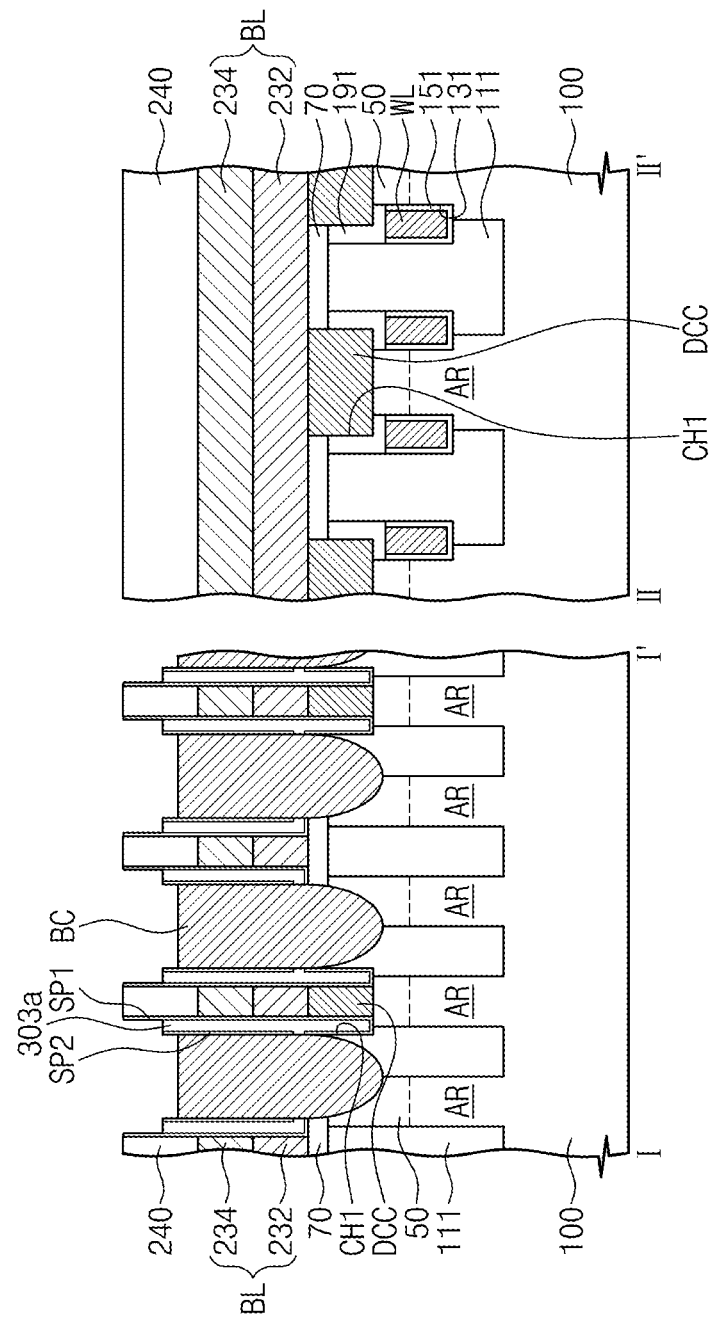

Referring to FIG. 22, a removal process may be performed to at least partially remove the upper portion of the storage node contact BC. The storage node contact BC may then have a top surface that is lower than the top surfaces of the second sub-spacer SP2 and the sacrificial spacer 303a. As the upper portion of the storage node contact BC is at least partially removed, the sidewall of the second sub-spacer SP2 may be at least partially exposed. The at least partial removal of the storage node contact BC may be performed by a dry etch process (e.g., an etch-back process).

Figure 23:
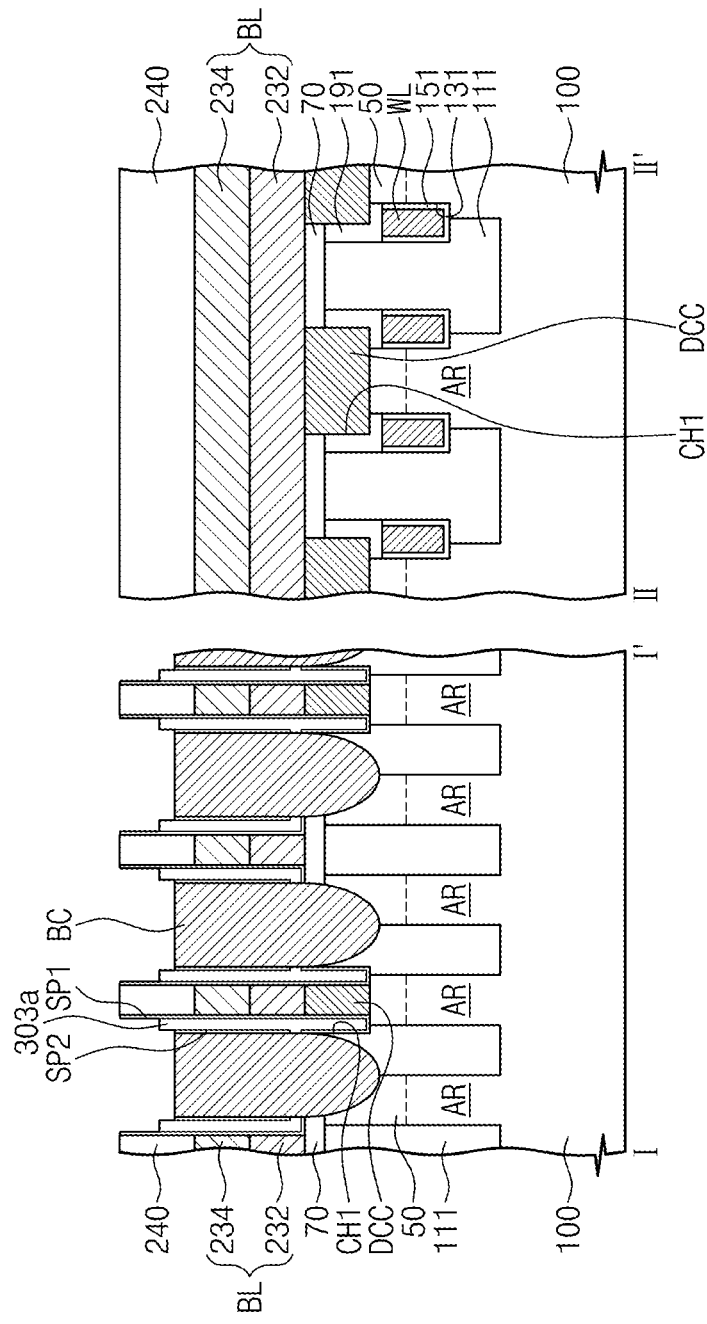

Referring to FIG. 23, a removal process may be performed to at least partially remove the upper portion of the second sub-spacer SP2 exposed from the storage node contact BC. The sacrificial spacer 303a may then have a sidewall at least partially exposed from the second sub-spacer SP2. The second sub-spacer SP2 may have a top surface coplanar with the top surface of the storage node contact BC. The at least partial removal of the second sub-spacer SP2 may be performed by a wet etch process with an etch recipe (e.g., phosphoric acid) having an etch selectivity with respect to the sacrificial spacer 303a.

Figure 24:
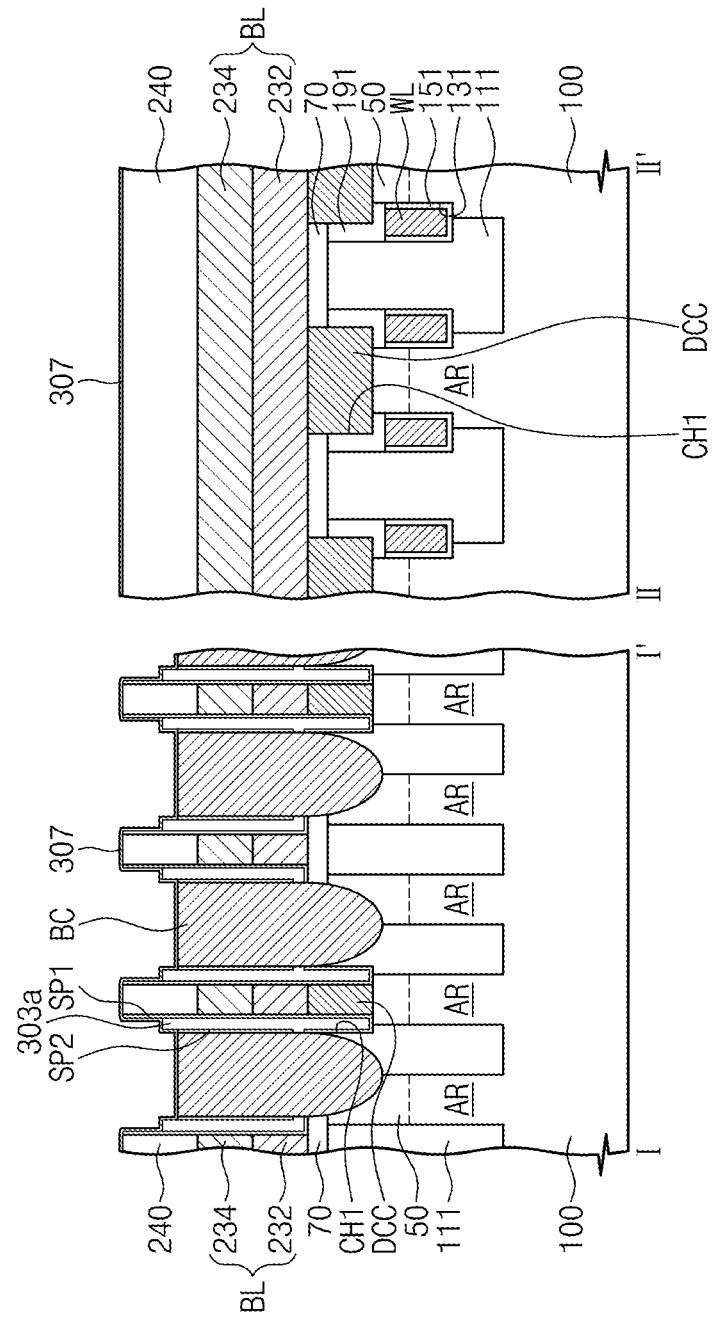

Referring to FIG. 24, the third spacer layer 307 may be formed to conformally cover the top surface of the storage node contact BC, the top surface of the second sub-spacer SP2, the top surface and at least a partial sidewall of the sacrificial spacer 303a at least partially exposed from the first sub-spacer SP1, the top surface and at least a partial sidewall of the first sub-spacer SP1, and the top surface of the insulative pattern 240. The third spacer layer 307 may include a material substantially the same as the material of the second sub-spacer SP2. For example, the third spacer layer 307 may include a silicon nitride layer.

Figure 25:
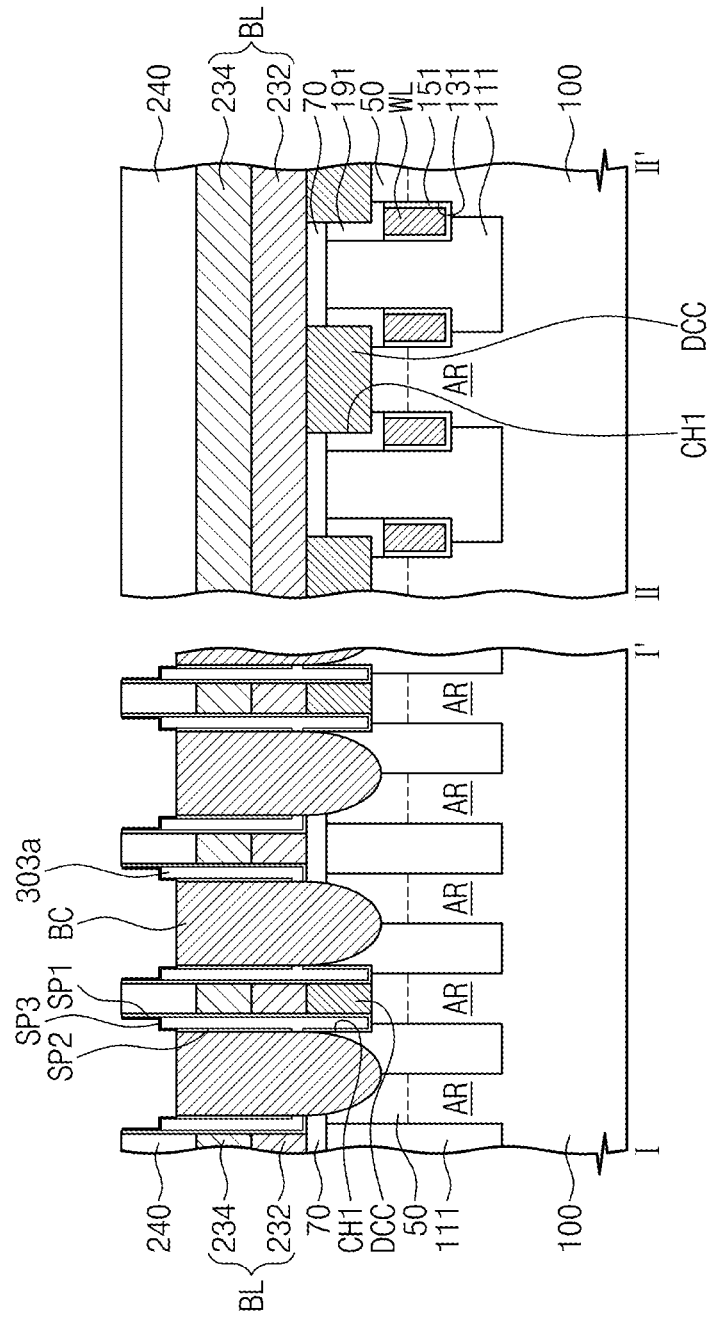

Referring to FIG. 25, the third sub-spacer SP3 may be formed by an etch process to remove a portion of the third spacer layer 307 that covers the top surface of the storage node contact BC and the top surface of the insulative pattern 240. The etch process may expose the top surface of the storage node contact BC and the top surface of the insulative pattern 240. The third sub-spacer SP3 may cover the top surface and at least a partial sidewall of the sacrificial spacer 303a exposed from the first and second sub-spacers SP1 and SP2, the top surface and at least a partial sidewall of the first sub-spacer SP1 exposed from the sacrificial spacer 303a, and a portion of the top surface of the second sub-spacer SP2.

Figure 26:
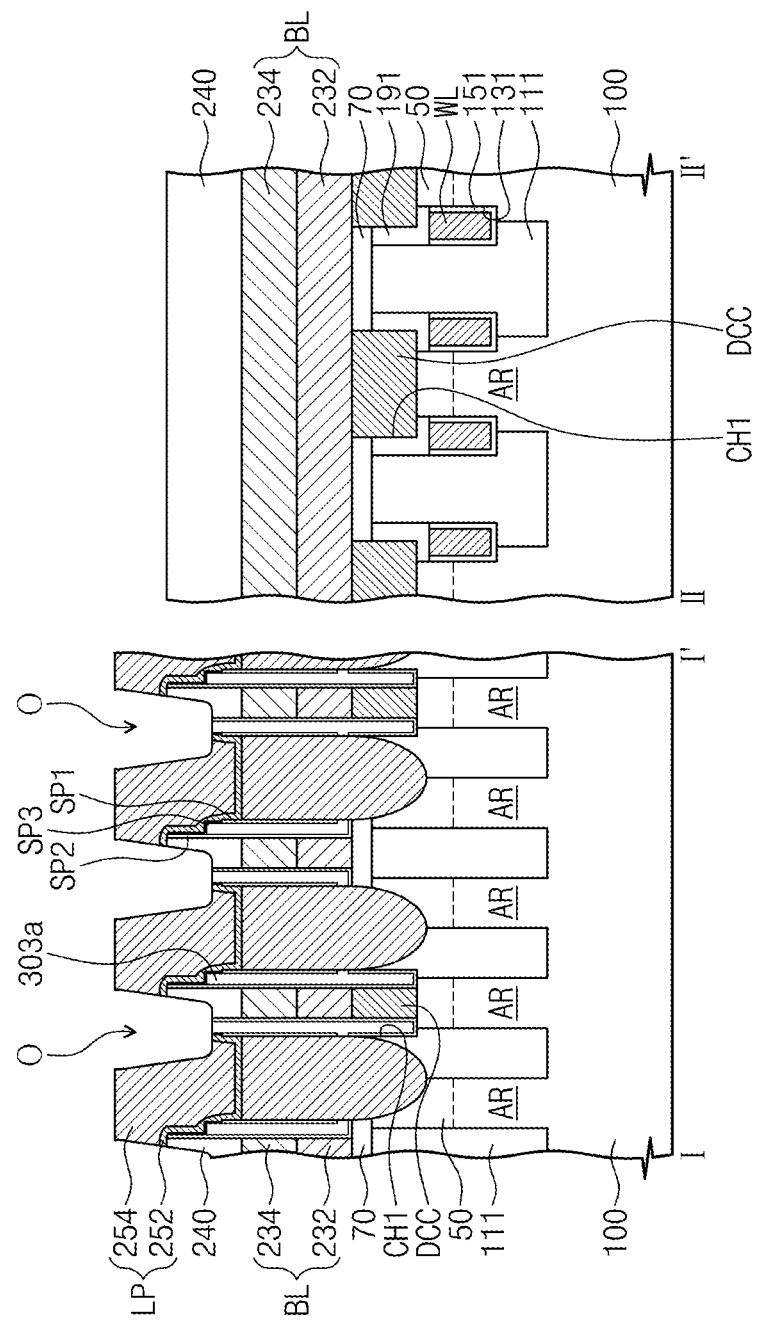

Referring to FIG. 26, an etch process may be performed to at least partially remove the upper portion of the storage node contact BC. The etch process may at least partially expose the sidewall of the second sub-spacer SP2. The storage node contact BC may have a top surface positioned below the top surface of the second sub-spacer SP2.

The landing pad LP may be disposed on the storage node contact BC. The landing pad LP may include the barrier pattern 252 and the metal pattern 254.

The upper portions of the first sub-spacer SP1, the sacrificial spacer 303a, and the third sub-spacer SP3 may be at least partially exposed to the space O between the landing pads LP.

Figure 27:
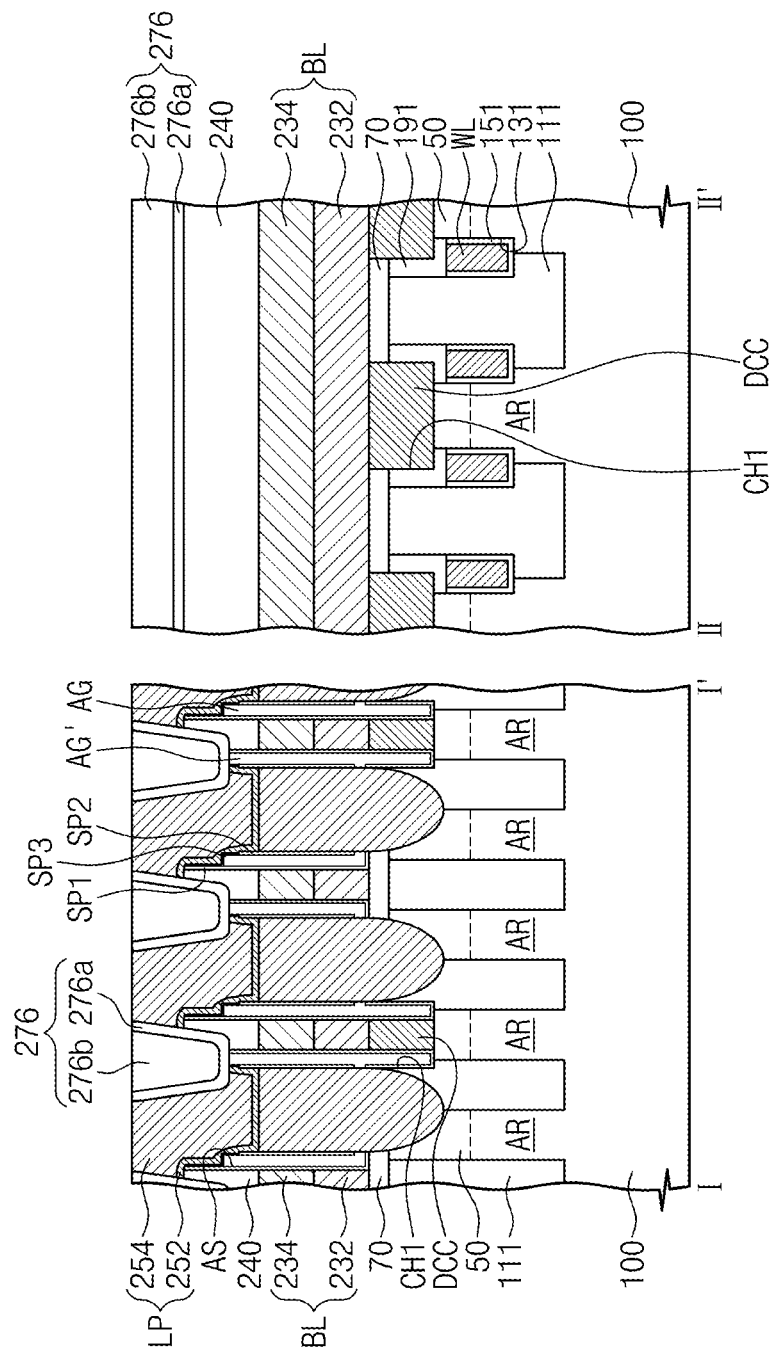

Referring to FIG. 27, the third sub-spacer SP3 exposed to the space O may be selectively removed. Accordingly, the hollow space AS may be formed between the first and second sub-spacers SP1 and SP2 and between the first and third sub-spacers SP1 and SP3.

The separation layer 276 may be formed within the space O. The separation layer 276 may include the first insulation layer 276a and the second insulation layer 276b. The first insulation layer 276a may conformally cover a sidewall of the metal pattern 254 exposed to the space O, the sidewall of the insulative pattern 240 exposed to the space O, the top surfaces of the first and third sub-spacers SP1 and SP3, and the entrance of the hollow space AS. The air gap AG may then be formed surrounded by the first sub-spacer SP1, the second sub-spacer SP2, the third sub-spacer SP3, and a portion of the storage node contact BC exposed between the second and first sub-spacers SP2 and SP1. The air gap AG' may also be formed surrounded by the first sub-spacer SP1, the second sub-spacer SP2, the third sub-spacer SP3, a portion of the storage node contact BC exposed between the second and first sub-spacers SP2 and SP1, and a portion of the first insulation layer 276a. The second insulation layer 276b may be formed on the first insulation layer 276a.

Referring back to FIG. 3A, the information storage element (e.g., a capacitor) may be formed on the landing pad LP.

According to example embodiments of the inventive concepts, the sacrificial spacer formed between the first and second sub-spacers may be exposed when an etch process is performed to form the landing pads, and the exposed sacrificial layer may be selectively removed, which may form the spacer including the air gap between the bit line and the storage node contact. It therefore may be possible to reduce a parasitic capacitance between the bit line and the storage node contact while securing a minimum critical width of the landing pad.

Although the example embodiments have been described in connection with the examples illustrated in the accompanying drawings, it is not limited thereto. It will be apparent to those skilled in the art that various substitution, modifications and changes may be thereto without departing from the scope and spirit of the invention.

What is claimed is:

1. A semiconductor device, comprising:
    a substrate including an active region that extends in a first direction;
    a plurality of bit line structures that run across the active region in a second direction crossing the first direction;
    a first spacer on a sidewall of one or more of the bit line structures; and
    a storage node contact on the active region between adjacent bit line structures,
    the first spacer including,
        a first part between the storage node contact and one or more of the bit line structures;
        a second part between the first part and the storage node contact; and
        a third part between the first part and the second part,
    a minimum vertical thickness of the first part being greater than a maximum vertical thickness of the third part, and
    the maximum vertical thickness of the third part being greater than a maximum vertical thickness of the second part.

2. The semiconductor device of claim 1, wherein the first spacer comprises an insulation layer and an air gap surrounded by the insulation layer.

3. The semiconductor device of claim 1, wherein the first part includes a first insulation layer, the second part includes a second insulation layer, and the third part includes a third insulation layer and an air gap surrounded by the third insulation layer, wherein the first to third insulation layers have substantially the same material.

4. The semiconductor device of claim 1, wherein a minimum vertical thickness of the third part is substantially the same as the maximum vertical thickness of the second part.

5. The semiconductor device of claim 1, wherein the third part comprises an upper portion exposed from the first and second parts, the upper portion having an angulated corner.

6. The semiconductor device of claim 1, wherein the third part comprises an upper portion exposed from the first and second parts, the upper portion having a rounded corner.

7. The semiconductor device of claim 1, further comprising a second spacer on opposite sidewall of one or more of the bit line structures and facing each other with the storage node contact therebetween,
wherein the second spacer includes,
a first part between the storage node contact and one or more of the bit line structures; and
a second part between the storage node contact and the first part of the second spacer,
wherein a minimum vertical thickness of the first part of the second spacer is greater than a maximum vertical thickness of the second part of the second spacer.

8. The semiconductor device of claim 7, wherein a maximum vertical thickness of the first part of the second spacer is substantially the same as the minimum vertical thickness of the first part of the second spacer.

9. The semiconductor device of claim 7, wherein the maximum vertical thickness of the second part of the second spacer is substantially the same as a minimum vertical thickness of the second part of the second spacer.

10. The semiconductor device of claim 1, wherein the second part has a top surface that is higher than a top surface of the storage node contact.

11. The semiconductor device of claim 1, further comprising a landing pad on the storage node contact,
wherein the landing pad is in contact with a top surface of the first part, a top surface of the second part, and a top surface of the third part.

12. A semiconductor device, comprising:
a substrate including an active region that extends in a first direction;
a plurality of bit line structures that run across the active region in a second direction crossing the first direction;
a first spacer on a sidewall of one or more of the bit line structures; and
a storage node contact on the active region between adjacent bit line structures,
the first spacer including,
a first part between the storage node contact and one or more of the bit line structures;
a second part between the first part and the storage node contact, the second part having a top surface that is lower than a top surface of the first part; and
a third part between the first part and the second part, the third part including an insulation layer and an air gap surrounded by the insulation layer, the air gap having a top surface positioned between the top surface of the first part and the top surface of the second part.

13. The semiconductor device of claim 12, wherein the third part has a top surface positioned between the top surface of the first part and the top surface of the second part.

14. The semiconductor device of claim 13, wherein the top surface of the first part, the top surface of the second part, and the top surface of the third part are exposed from the storage node contact.

15. The semiconductor device of claim 13, further comprising a landing pad on the storage node contact,
wherein the landing pad is in contact with the top surface of the first part, the top surface of the second part, and the top surface of the third part.

* * * * *